United States Patent
Fujita

(10) Patent No.: US 9,196,561 B2
(45) Date of Patent: Nov. 24, 2015

(54) SEMICONDUCTOR DEVICE TO BE ATTACHED TO HEAT RADIATION MEMBER

(71) Applicant: DENSO CORPORATION, Kariya, Aichi-pref. (JP)

(72) Inventor: Toshihiro Fujita, Chita-gun (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/339,653

(22) Filed: Jul. 24, 2014

(65) Prior Publication Data

US 2015/0035136 A1 Feb. 5, 2015

(30) Foreign Application Priority Data

Aug. 2, 2013 (JP) ................. 2013-161220

(51) Int. Cl.
  *H01L 23/367* (2006.01)
  *H01L 23/40* (2006.01)
  *H01L 23/00* (2006.01)
  *H01L 23/433* (2006.01)
  *H01L 25/07* (2006.01)

(52) U.S. Cl.
  CPC .......... *H01L 23/367* (2013.01); *H01L 23/4006* (2013.01); *H01L 23/4334* (2013.01); *H01L 24/34* (2013.01); *H01L 25/072* (2013.01); *H01L 2023/405* (2013.01); *H01L 2023/4031* (2013.01); *H01L 2924/13055* (2013.01); *H01L 2924/13091* (2013.01)

(58) Field of Classification Search
  CPC ............ H01L 23/4006; H01L 23/4334; H01L 2023/4031; H01L 2023/405
  USPC ...................................... 257/712
  See application file for complete search history.

(56) References Cited

U.S. PATENT DOCUMENTS

| 2012/0286712 | A1  | 11/2012 | Tsuboi et al. |
| 2012/0306328 | A1* | 12/2012 | Fujita .................. H01L 23/4006 310/68 D |
| 2013/0221532 | A1  | 8/2013  | Fujita et al. |
| 2013/0307129 | A1  | 11/2013 | Fujita et al. |

FOREIGN PATENT DOCUMENTS

| JP | 2001-320185 | 11/2001 |
| JP | 2007-165426 | 6/2007 |

OTHER PUBLICATIONS

Office Action (2 pages) dated May 7, 2015, issued in corresponding Japanese Application No. 2013-161220 and English translation (4 pages).

* cited by examiner

*Primary Examiner* — Daniel Shook
(74) *Attorney, Agent, or Firm* — Nixon & Vanderhye PC

(57) ABSTRACT

A semiconductor device includes a semiconductor module and a pressing member pressing the semiconductor module to a heat radiation member. The semiconductor module includes heat generation elements generating heat by energization, three or more conductive members each of which mounted with at least one of the heat generation elements, and a molding part integrally molding the heat generation elements and the conductive members. The semiconductor module has a heat radiation possible region in which a forcing pressure by the pressing member is equal to or greater than a predetermined pressure. The conductive member mounted with the heat generation element disposed outside the heat radiation possible region has such a shape that at least a part of the conductive member is included in the heat radiation possible region.

9 Claims, 17 Drawing Sheets

SEMICONDUCTOR DEVICE TO BE ATTACHED TO HEAT RADIATION MEMBER

CROSS REFERENCE TO RELATED APPLICATIONS

The present application is based on and claims priority to Japanese Patent Application No. 2013-161220 filed on Aug. 2, 2013, the contents of which are incorporated in their entirety herein by reference.

TECHNICAL FIELD

The present disclosure relates to a semiconductor device to be attached to a heat radiation member.

BACKGROUND

Conventionally, it is known to attach a semiconductor device to a cooling heat sink, for example, by screws. For example, in JP-A-2007-165426, screw fastening portions are provided in the vicinity of ends in a long side direction of a semiconductor device and the semiconductor device is fixed to a cooling heat sink by screws.

However, in a case where a semiconductor device and a cooling heat sink are fixed by screws in the vicinity of ends in a long side direction as described in JP-A-2007-165426, a forcing pressure may be insufficient at a center portion of the semiconductor device far from the screws, the semiconductor device and the cooling heat sink may be not closely in contact with each other, and a heat radiation may be insufficient.

SUMMARY

It is an object of the present disclosure to provide a semiconductor device that can efficiently radiate heat generated by energization of a heat generation element and that can be downsized.

A semiconductor device according to an aspect of the present disclosure includes a semiconductor module and a pressing member pressing the semiconductor module to a heat radiation member. The semiconductor module includes a plurality of heat generation elements generating heat by energization, three or more conductive members each of which is mounted with at least one of the heat generation elements, and a molding part integrally molding the heat generation elements and the conductive members. The semiconductor module has a heat radiation possible region in which a forcing pressure by the pressing member is equal to or greater than a predetermined pressure. At least one of the conductive members is mounted with the heat generation element disposed outside the heat radiation possible region. The at least one of the conductive members has such a shape that at least a part of the conductive member is included in the heat radiation possible region.

The heat generated by the heat generation element disposed outside the heat radiation possible region is transferred via the conductive member and is radiated from the heat radiation possible region to the heat radiation member. Accordingly, the heat generated by the heat generation element disposed outside the heat radiation possible region can be efficiently radiated, many heat generation elements can be disposed with respect to the one pressing member, and the semiconductor module can be downsized. In addition, compared with a case where all of the heat generation elements are disposed in the heat radiation possible region, a flexibility of layout can be improved. Furthermore, the number of the pressing member can be reduced.

BRIEF DESCRIPTION OF THE DRAWINGS

Additional objects and advantages of the present disclosure will be more readily apparent from the following detailed description when taken together with the accompanying drawings. In the drawings.

DETAILED DESCRIPTION

First Embodiment

Figure 1:
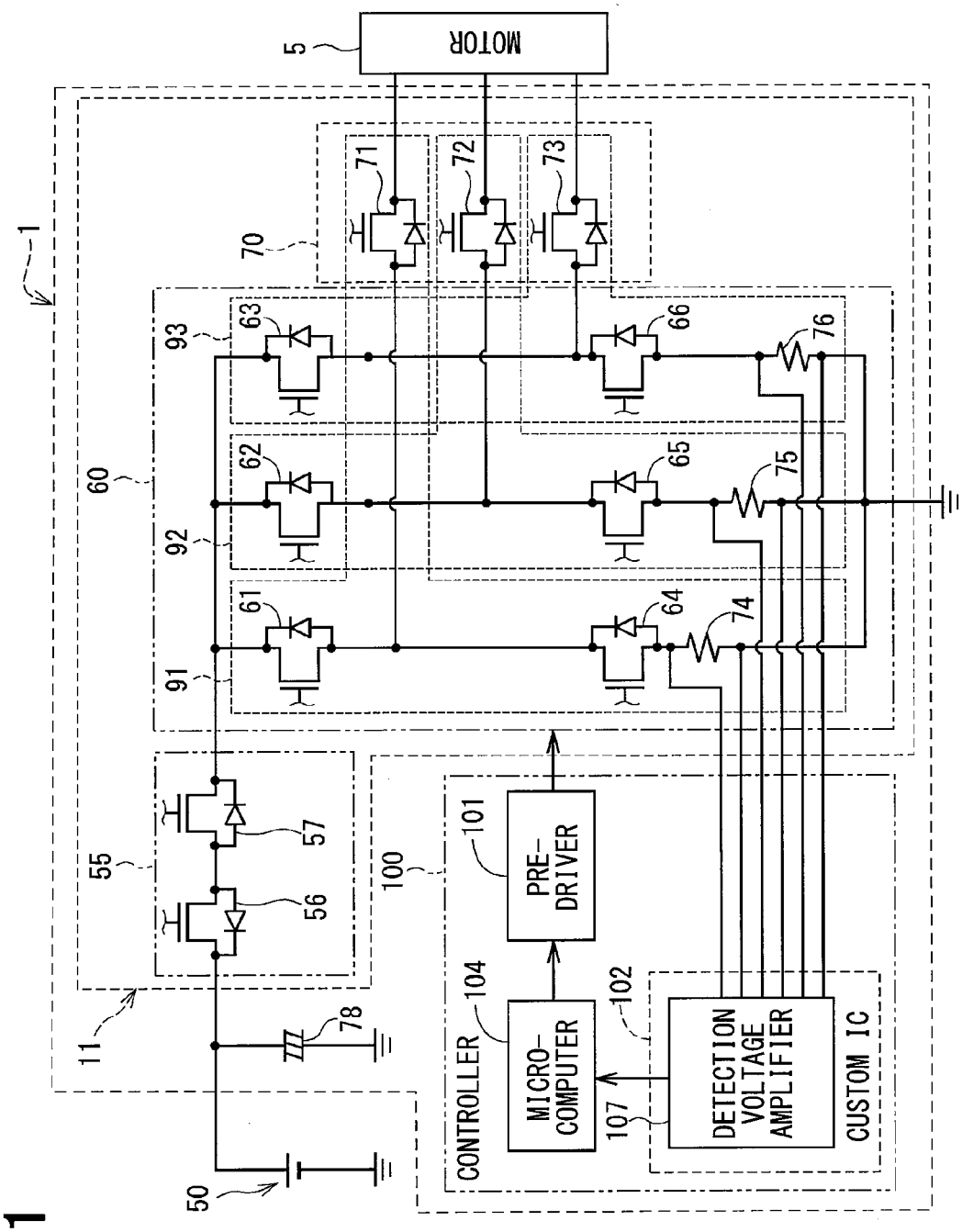
FIG. 1 is a block diagram illustrating a circuit configuration of a motor drive apparatus according to a first embodiment of the present disclosure.

A semiconductor device according to a first embodiment of the present disclosure will be described with reference to FIG. 1 through FIG. 4. The semiconductor device according to the present embodiment can be applied, for example, to a motor drive apparatus. Firstly, a circuit configuration of a motor drive apparatus to which a semiconductor module according to the present embodiment is applied will be described with reference to FIG. 1.

A motor drive apparatus 1 includes a semiconductor device 10 (see FIG. 2), a capacitor 78, and a controller 100. The motor drive apparatus 1 converts a direct-current power of a battery 50 as a power supply source into a three-phase alternating-current power and drives a motor 5 as a load. In the present embodiment, the motor 5 is a three-phase brushless motor.

Figure 2:
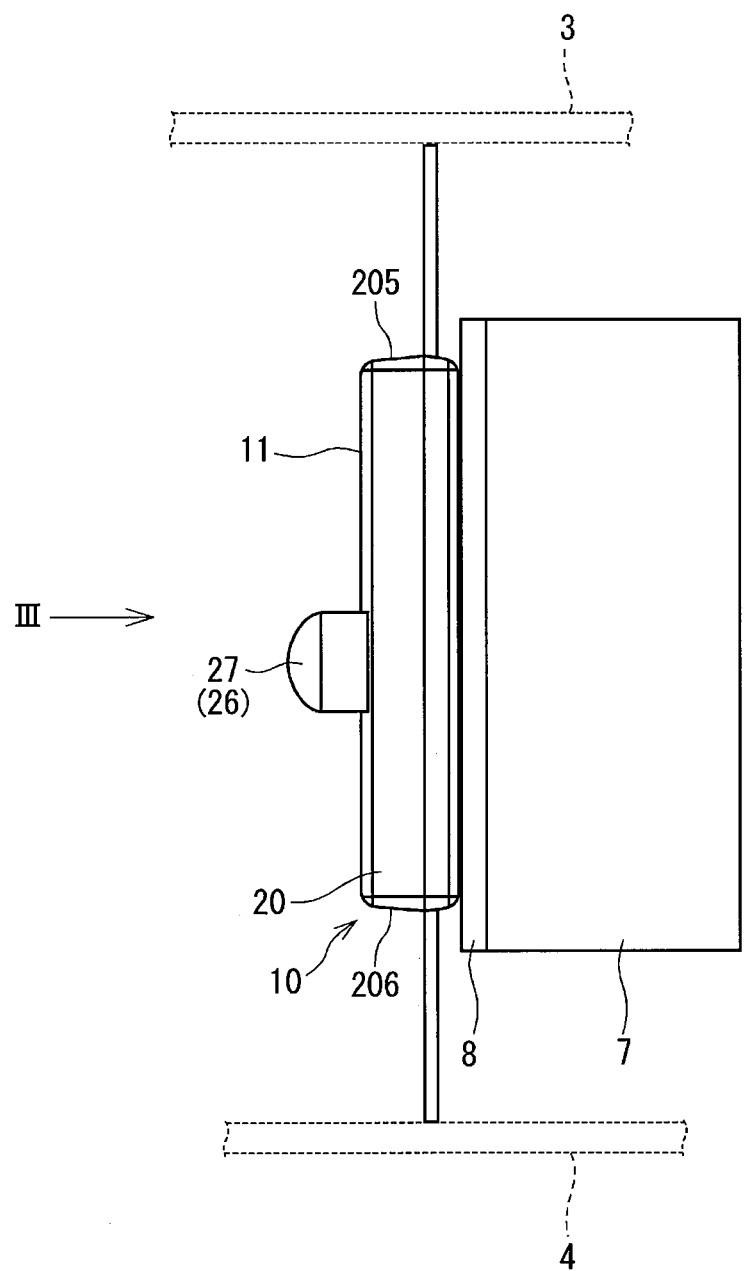
FIG. 2 is a side view illustrating a semiconductor device according to the first embodiment attached to a heat sink.

The semiconductor device 10 includes a semiconductor module 11 and pressing members 26, 27 (see FIG. 2). The semiconductor module 11 includes a power supply relay section 55, an inverter section 60, and a motor relay section 70. The power supply relay section 55 includes two power supply relays 56, 57 connected in series. In the present embodiment, each of the power supply relays 56, 57 is a metal-oxide-semiconductor field-effect transistor (MOSFET), which is a kind of a field-effect transistor. A source and a drain of each of the power supply relays 56, 57 are connected or disconnected due to a gate potential. Accordingly, the power supply relay section 55 electrically connects or disconnects the battery 50 and the inverter section 60.

The power supply relay 56 is provided so as to interrupt electric current flowing toward the motor 5 when a disconnection failure or a short failure occurs. The power supply relay 57 is connected in such a manner that a direction of a parasitic diode associated with the power supply relay 57 is a reverse direction of a parasitic diode associated with the power supply relay 56. Accordingly, even when the battery 50 or the capacitor 78 is erroneously connected in a reverse direction, flow of a reverse electric current from the inverter section 60 toward the battery 50 is restricted.

The inverter section 60 includes six switching elements 61-66 that form a bridge circuit. Each of the switching elements 61-66 is a MOSFET, which is a kind of a field-effect transistor, similarly to the power supply relays 56, 57, and a source and a drain are connected or disconnected due to a gate potential. The switching elements 61, 62, 63 are disposed on a high-potential side of the bridge circuit and form an upper arm. The switching elements 64, 65, 66 are disposed on a low-potential side of the bridge circuit and form a lower arm.

The motor relay section 70 includes motor relays 71, 72, 73 as load relays. The motor relays 71, 72, 73 are connected between connection points of the switching elements 61, 62, 63 and the switching elements 64, 65, 66 of respective phases and respective phase windings of the motor 5. The motor relays 71, 72, 73 are provided so as to interrupt flow of electric current for each phase when a disconnection failure or a short failure occurs. Each of the motor relays 71, 72, 73 is a MOSFET, which is a kind of field-effect transistor, similarly to the power supply relays 56, 57 and the switching elements 61-66, and a source and a drain are connected or disconnected due to a gate potential. In the present embodiment, the power supply relays 56, 57, the switching elements 61-66, and the motor relays 71-73 are heat generation elements. In the following description, at least a part of the power supply relays 56, 57, the switching elements 61-66, and the motor relays 71-73 are sometimes collectively referred to as heat generation elements.

In the present embodiment, the inverter section 60 and the motor relay section 70 form a U-phase circuit 91, a V-phase circuit 92, and a W-phase circuit 93. The U-phase circuit 91 includes the switching elements 61, 64 and the motor relay 71. The drain of the switching element 61 is connected to a high potential line that is connected to a high-potential side of the battery 50, and the source of the switching element 61 is connected to the drain of the switching element 64. The source of the switching element 64 is connected to the ground via a shunt resistor 74. The connection point of the switching element 61 and the switching element 64 is connected to a U-phase winding of the motor 5 via the motor relay 71.

The V-phase circuit 92 includes the switching elements 62, 65 and the motor relay 72. The drain of the switching element 62 is connected to the high potential line that is connected to the high-potential side of the battery 50, and the source of the switching element 62 is connected to the drain of the switching element 65. The source of the switching element 65 is connected to the ground via a shunt resistor 75. The connection point of the switching element 62 and the switching element 65 is connected to a V-phase winding of the motor 5 via the motor relay 72.

The W-phase circuit 93 includes the switching elements 63, 66 and the motor relay 73. The drain of the switching element 63 is connected to the high potential line that is connected to the high-potential side of the battery 50, and the source of the switching element 63 is connected to the drain of the switching element 66. The source of the switching element 66 is connected to the ground via a shunt resistor 76. The connection point of the switching element 63 and the switching element 66 is connected to a W-phase winding of the motor 5 via the motor relay 73.

The shunt resistors 74-76 detect electric currents supplied to the respective phases of the motor 5. Specifically, the shunt resistor 74 detects an electric current supplied to the U-phase winding, the shunt resistor 75 detects an electric current supplied to the V-phase winding, and the shunt resistor 76 detects an electric current supplied to the W-phase winding.

The capacitor 78 is connected between a high-potential electrode of the battery 50 and the inverter section 60. The capacitor 78 reduces noises transferred from other devices that share the battery 50. In addition, the capacitor 78 reduces noises transferred from the motor drive apparatus 1 to other devices that share the battery 50. In the present embodiment, the capacitor 78 is an aluminum electrolyte capacitor. The capacitor 78 is mounted on a power substrate 3 (see FIG. 2).

The controller 100 includes a pre-driver 101, a custom IC 102, and a microcomputer 104. Electronic components forming the controller 100, such as the pre-driver 101, the custom IC 102, and the microcomputer 104, are mounted on a control substrate 4 (see FIG. 2). The custom IC 102 includes a detection voltage amplifier 107 as a functional block. The detection voltage amplifier 107 detects voltages across the shunt resistors 74-76, and outputs amplified voltages to the microcomputer 104.

The microcomputer 104 detects the electric current supplied to the respective phases of the motor 5 based on the voltages across the shunt resistors 74-76 input from the detection voltage amplifier 107. In addition, the microcomputer 104 receives various signals such as rotation angle signal of the motor 5. The microcomputer 104 controls the inverter section 60 via the pre-driver 101 based on the input signals. Specifically, the microcomputer 104 turns on/off the switching elements 61-66 by changing the gate voltages of the switching elements 61-66. Similarly, the microcomputer 104 turns on/off the power supply relays 56, 57 and the motor relays 71, 72, 73 by changing the gate voltages.

Figure 3:
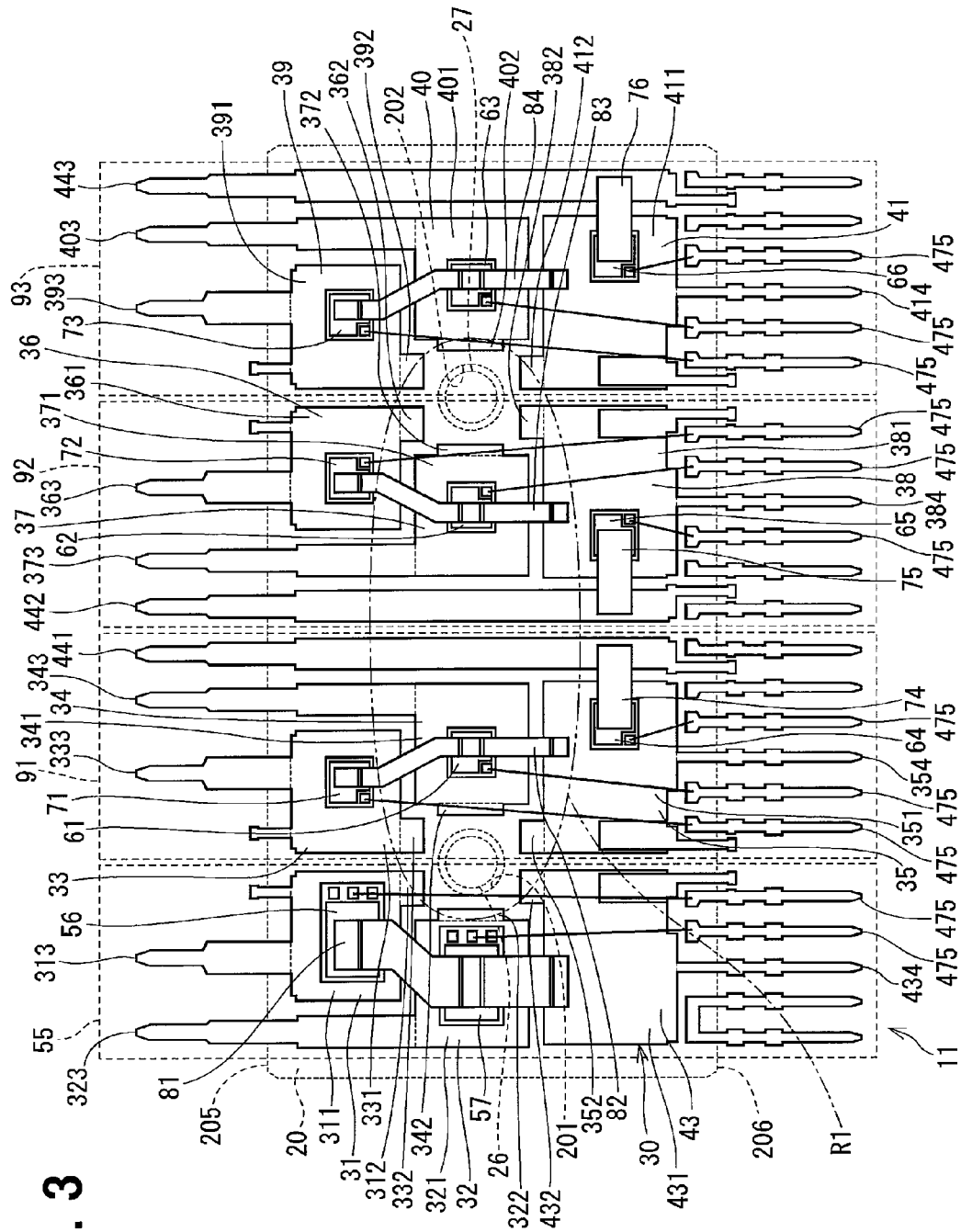
FIG. 3 is a plan view illustrating an internal configuration of a semiconductor module according to the first embodiment.
Figure 4:
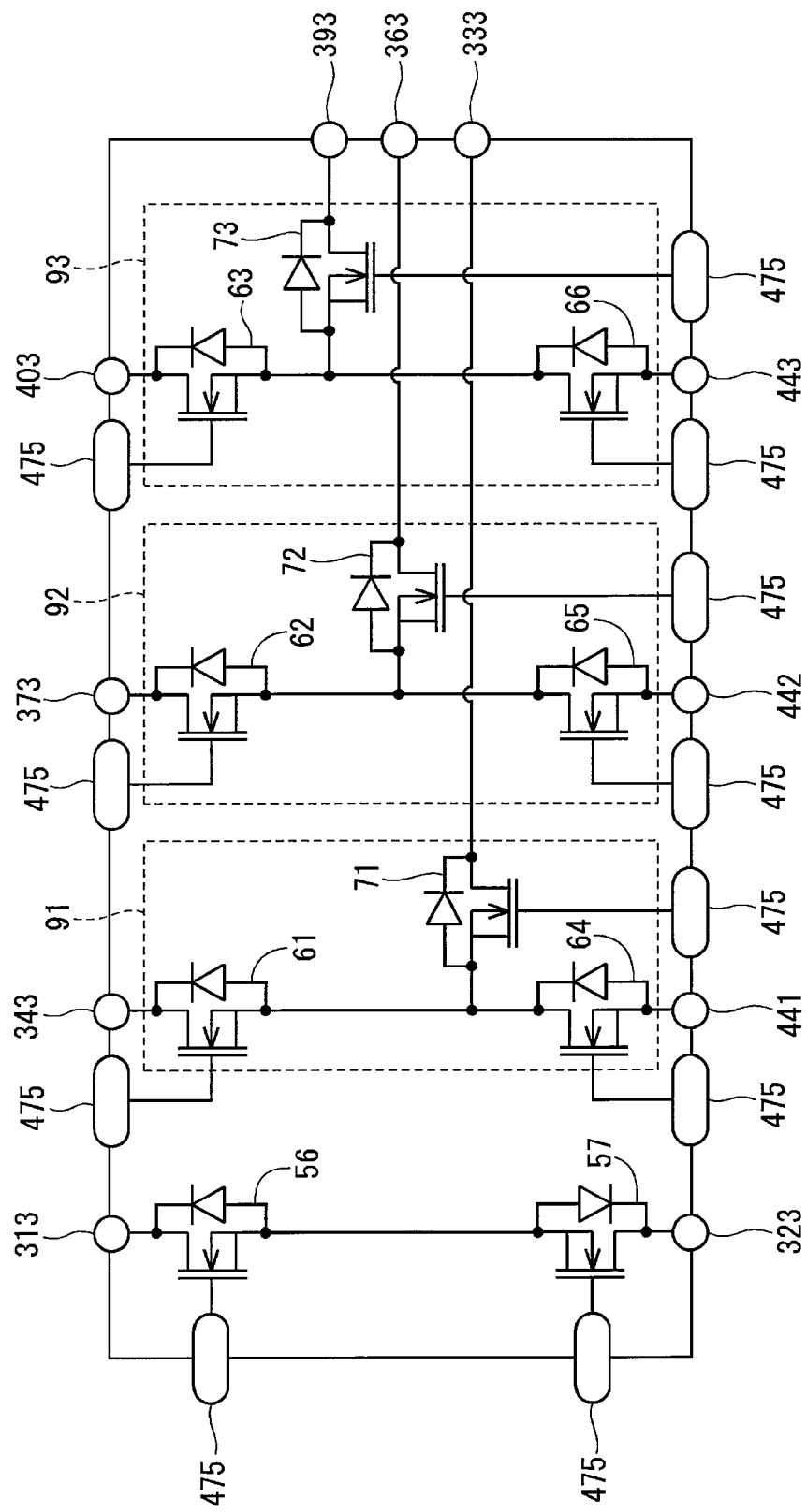
FIG. 4 is a circuit diagram illustrating a circuit configuration of the semiconductor module according to the first embodiment.

In the present embodiment, the power supply relay section 55, the inverter section 60, and the motor relay section 70 are modulized as one semiconductor module 11. The semiconductor module 11 will be described with reference to FIG. 2 to FIG. 4. FIG. 2 is a side view illustrating a state where the semiconductor module 11 is attached to a heat sink 7. FIG. 3 is a plan view illustrating an internal configuration of a semiconductor module 11 viewed from a direction shown by the arrow III in FIG. 2. FIG. 4 is a circuit diagram mainly illustrating relationships between terminals and circuits in the semiconductor module 11.

The semiconductor module 11 includes a lead frame 30 and a molding part 20 molding the lead frame 30. The lead frame 30 is made of material, such as copper plate, having a high electric conductivity and a high thermal conductivity. The semiconductor module 11 is formed into a plate shape as a whole. The molding part 20 has insertion holes 201, 202.

The semiconductor module 11 is fixed to the heat sink 7 as a heat radiation member with the pressing members 26, 27 inserted into the insertion holes 201, 202. The pressing members 26, 27 are, for example, screws. The semiconductor module 11 is fixed to the heat sink 7 in such a manner that one long side 205 of the molding part 20 faces the power substrate 3 and the other long side 206 of the molding part 20 faces the control substrate 4.

Although it is not illustrated, on a surface of the semiconductor module 11 facing the heat sink 7, a part of the lead frame 30 is exposed from the molding part 20 of the semiconductor module 11 as a metal heat radiation portion. In other words, the semiconductor module 11 according to the present embodiment is half molded. The metal heat radiation portion of the semiconductor module 11 is in contact with the heat sink 7 via a heat radiation sheet 8. Thus, the semiconductor module 11 can efficiently radiate heat.

As illustrated in FIG. 3, the lead frame 30 includes lands 31-41 as conductive members. The lands 31-35 are disposed around the pressing member 26 and the lands 36-41 are disposed around the pressing member 27.

The land 31 includes a base portion 311, a protruding portion 312, and a power terminal 313. In FIG. 3, a boundary between the base portion 311 and the protruding portion 312 and a boundary between the base portion 311 and the power terminal 313 are illustrated by dashed lines. Boundaries in the other lands are also illustrated by dashed lines. The base portion 311 has a substantially rectangular shape, and the power supply relay 56 is mounted on the base portion 311. The source of the power supply relay 56 is formed on an upper surface opposite from the base portion 311. The drain of the power supply relay 56 is formed on a surface facing the base portion 311 and is connected with the base portion 311. The gate of the power supply relay 56 is connected to a gate terminal 475 by a wire. When a gate signal is transmitted from the control substrate 4 to the gate of the power supply relay 56 via the gate terminal 475, the power supply relay 56 is turned on/off. Arrangements of the gate, the source, and the drain of the power supply relay 57, the switching elements 61-66, and the motor relays 71-73, and connection relationships between the gates and the gate terminal 475 are similar to power supply relay 56.

The protruding portion 312 protrudes from an end of the base portion 311 adjacent to the pressing member 26. The power terminal 313 protrudes from an end of the base portion 311 adjacent to the long side 205. The power terminal 313 is connected to the high-potential side of the battery 50 via the power substrate 3.

The land 32 includes a base portion 321, a protruding portion 322, and a power terminal 323. The base portion 321 has a substantially rectangular shape, and the power supply relay 57 is mounted on the base portion 321. The protruding portion 322 protrudes from an end of the base portion 321 adjacent to the pressing member 26. The power terminal 323 protrudes from an end of the base portion 321 adjacent to the long side 205. The power terminal 323 is connected to the inverter section 60 via the power substrate 3.

A non-mounted land 43 includes a base portion 431, a protruding portion 432, and a control terminal 434. The protruding portion 432 protrudes from an end of the base portion 431 adjacent to the pressing member 26. The control terminal 434 protrudes from an end of the base portion 431 adjacent to the long side 206 and is connected to the control substrate 4. On the non-mounted land 43, a heat generation element is not mounted. Thus, the non-mounted land 43 is not included in a concept of the conductive members in the present disclosure. The source of the power supply relay 56, the source of the power supply relay 57, and the non-mounted land 43 are connected by a wiring member 81. The wiring member 81 is, for example, a copper clip.

The land 33 includes a base portion 331, a protruding portion 332, and a power terminal 333. The base portion 331 has a substantially rectangular shape, and the motor relay 71 is mounted on the base portion 331. The protruding portion 332 protrudes from an end of the base portion 331 adjacent to the pressing member 26. The power terminal 333 protrudes from an end of the base portion 331 adjacent to the long side 205. The power terminal 333 is connected to the U-phase winding of the motor 5 via the power substrate 3.

The land 34 includes a base portion 341, a protruding portion 342, and a power terminal 343. The base portion 341 has a substantially rectangular shape, and the switching element 61 is mounted on the base portion 341. The protruding portion 342 protrudes from an end of the base portion 341 adjacent to the pressing member 26. The power terminal 343 is connected to the power supply relay section 55 via the power substrate 3.

The land 35 includes a base portion 351, a protruding portion 352, and a control terminal 354. The base portion 351 has a substantially rectangular shape, and the switching element 64 is mounted on the base portion 351. The protruding portion 352 protrudes from an end of the base portion 351 adjacent to the pressing member 26. The control terminal 354 protrudes from an end of the base portion 351 adjacent to the long side 206 and is connected to the control substrate 4.

The source of the motor relay 71, the source of the switching element 61, and the land 35 connected to the drain of the switching element 64 are connected by a wiring member 82. The source of the switching element 64 is connected to a ground terminal 441 via the shunt resistor 74. The ground terminal 441 is connected to the ground via the power substrate 3.

The land 36 includes a base portion 361, a protruding portion 362, and a power terminal 363. The base portion 361 has a substantially rectangular shape, and the motor relay 72 is mounted on the base portion 361. The protruding portion 362 protrudes from an end of the base portion 361 adjacent to the pressing member 27. The power terminal 363 protrudes from an end of the base portion 361 adjacent to the long side 205. The power terminal 363 is connected to the V-phase winding of the motor 5 via the power substrate 3.

The land 37 includes a base portion 371, a protruding portion 372, and a power terminal 373. The base portion 371 has a substantially rectangular shape, and the switching element 62 is mounted on the base portion 371. The protruding portion 362 protrudes from an end of the base portion 371 adjacent to the pressing member 27. The power terminal 373 protrudes from an end of the base portion 371 adjacent to the long side 205. The power terminal 373 is connected to the power supply relay section 55 via the power substrate 3.

The land 38 includes a base portion 381, a protruding portion 382, and a control terminal 384. The base portion 381 has a substantially rectangular shape, and the switching element 65 is mounted on the base portion 381. The protruding portion 382 protrudes from an end of the base portion 381 adjacent to the pressing member 27. The control terminal 384 protrudes from an end of the base portion 381 adjacent to the long side 206 and is connected to the control substrate 4.

The source of the motor relay 72, the source of the switching element 62, and the land 38 connected to the drain of the switching element 65 are connected by a wiring member 83. The source of the switching element 65 is connected to a ground terminal 442 via the shunt resistor 75. The ground terminal 442 is connected to the ground via the power substrate 3.

The land 39 includes a base portion 391, a protruding portion 392, and a power terminal 393. The base portion 391 has a substantially rectangular shape, and the motor relay 73 is mounted on the base portion 391. The protruding portion 392 protrudes from an end of the base portion 391 adjacent to the pressing member 27. The power terminal 393 protrudes from an end of the base portion 391 adjacent to the long side 205. The power terminal 393 is connected to the W-phase winding of the motor 5 via the power substrate 3.

The land 40 includes a base portion 401, a protruding portion 402, and a power terminal 403. The base portion 401 has a substantially rectangular shape, and the switching element 63 is mounted on the base portion 401. The protruding portion 402 protrudes from an end of the base portion 401 adjacent to the pressing member 27. The power terminal 403 protrudes from an end of the base portion 401 adjacent to the long side 205. The power terminal 403 is connected to the power supply relay section 55 via the power substrate 3.

The land 41 includes a base portion 411, a protruding portion 412, and a control terminal 414. The base portion 411 has a substantially rectangular shape, and the switching element 66 is mounted on the base portion 411. The protruding portion 412 protrudes from an end of the base portion 411 adjacent to the pressing member 27. The control terminal 414 protrudes from an end of the base portion 411 adjacent to the long side 206 and is connected to the control substrate 4.

The source of the motor relay 73, the source of the switching element 63, and the land 41 connected to the drain of the switching element 66 are connected by a wiring member 84. The source of the switching element 66 is connected to a ground terminal 443 via the shunt resistor 76. The ground terminal 443 is connected to the ground via the power substrate 3.

The power terminals 313, 323, 343, 363, 373, 393, 403, 441-443 protrude from the long side 205 of the molding part 20 and are connected to the power substrate 3. In the present embodiment, a top end of the power terminal 313 is narrower than a base end of the power terminal 313. However, the power terminal 313 may have any shape. The other power terminals 323, 333, 343, 363, 373, 393, 403, 441-443 may also have any shapes. The control terminals 354, 384, 414, 434 protrude from the long side 206 of the molding part 20 and are connected to the control substrate 4. The control terminals 354, 384, 414, 434 are narrower than the power terminals 313, 323, 333, 343, 363, 373, 393, 403, 441-443.

In the present embodiment, the power supply relays 56, 57, the switching elements 61, 64, and the motor relay 71, which correspond to the heat generation elements, are disposed around the pressing member 26. In addition, the switching elements 62, 63, 65, 66, and the motor relays 72, 73 are disposed around the pressing member 27.

The semiconductor module 11 is fixed to the heat sink 7 using the pressing members 26, 27. A forcing pressure between the semiconductor module 11 and the heat sink 7 is larger at positions closer to the pressing members 26, 27, and the forcing pressure is smaller at positions farther from the pressing members 26, 27. In other words, a degree of contact between the semiconductor module 11 and the heat sink 7 and a heat radiation property is higher at positions closer to the pressing members 26, 27, and the degree of contact the heat radiation property is lower at position farther from the pressing members 26, 27.

Thus, from an aspect of heat radiation property, it is preferable to dispose the heat generation elements, such as the power supply relays 56, 57, the switching elements 61-66, and the motor relays 71-73, close to the pressing members 26, 27. Specifically, it is preferable to dispose all of the heat generation elements in a heat radiation possible region R1 illustrated by dashed-dotted line in FIG. 3 in which the forcing pressure by the pressing members 26, 27 is equal to or greater than a predetermined pressure.

On the other hand, in a case where many heat generation elements (for example, three or more heat generation elements) are disposed with respect to one of the pressing members 26, 27 as in the present embodiment, there is a possibility that all of the heat generation elements cannot be disposed in the heat radiation possible region R1 because of a restriction of layout. As illustrated in FIG. 3, in the present embodiment, the heat generation elements other than the switching elements 61, 62 are disposed outside the heat radiation possible region R1.

A pressing member may be added to a position where a degree of contact is insufficient so that the forcing pressure in a region where the power supply relays 56, 57, the switching elements 61-66, and the motor relays 71-73 are mounted is equal to or greater than the predetermined pressure. However, if the pressing member is added, the number of components increases and a size of the semiconductor module 11 increases because an insertion hole into which the pressing member is inserted is also added.

Thus, the present embodiment focuses on that the heat radiation property can be secured if a face pressure of at least a part of the land 31 is equal to or greater than the predetermined pressure, and at least a part of the land 31 on which the power supply relay 56, which is the heat generation element disposed outside the heat radiation possible region R1, is mounted is included in the heat radiation possible region R1. Specifically, the protruding portion 312 protrudes from the end of the base portion 311 of the land 31 adjacent to the pressing member 26, and a part of the protruding portion 312 is included in the heat radiation possible region R1. In other words, a part of the land 31 is included in the heat radiation possible region R1 because the protruding portion 312 is formed.

The land 31 is made of the material having the high electric conductivity and the high thermal conductivity. Thus, when at least a part of the land 31 is included in the heat radiation possible region R1, even when the power supply relay 56 mounted on the land 31 is disposed outside the heat radiation possible region R1, heat generated by the power supply relay 56 is transferred via the land 31, and the heat can be efficiently radiated from a position where the forcing pressure by the pressing member 26 is large toward the heat sink 7. The forcing pressure by the pressing member 26 is larger at a position closer to the pressing member 26, and the protruding portion 312 protrudes from the end of the base portion 311 adjacent to the pressing member 26. Thus, the protruding portion 312 is disposed at a position where the forcing pressure by the pressing member 26 is larger. Accordingly, the heat generated by the power supply relay 56 can be radiated with high efficiency.

In addition, an area of the protruding portion 312 in the land 31 is smaller than the base portion 311. Because the area of the protruding portion 312 in the heat radiation possible area R1 is smaller, many heat generation elements can be disposed around the pressing member 26, and the semiconductor module 11 can be downsized. The same can be said of the other lands 32-41.

In addition, all of the lands 31, 32, 33, 34, 35 disposed corresponding to the pressing member 26 respectively have the protruding portions 312, 322, 332, 342, 352. The protruding portions 312, 322, 332, 342, 352 are formed to surround the pressing member 26. Similarly, all of the lands 36, 37, 38, 39, 40, 41 disposed corresponding to the pressing member 27 respectively have the protruding portions 362, 372, 382, 392, 402, 412. The protruding portions 362, 372, 382, 392, 402, 412 are formed to surround the pressing member 27. Accordingly, the area of the lands 31-41 on which the heat generation elements can be mounted can be largely secured in the heat radiation possible region R1 corresponding to each of the pressing members 26, 27. Thus, many heat generation elements can be disposed with respect to each of the pressing members 26, 27. Accordingly, the semiconductor device 10 can be downsized.

In the present embodiment, the semiconductor module 11 is fixed to the heat sink 7 with the two pressing members 26, 27. Because the forcing pressure by the two pressing members 26, 27 acts on a region between the two pressing members 26, 27, the forcing pressure at the region between the two pressing members 26, 27 is relatively large. The switching elements 61, 62 disposed in the region between the pressing members 26, 27 are wholly included in the heat radiation possible region R1. Thus, the protruding portion 342 in the land 34 on which the switching element 61 is mounted and the protruding portion 372 in the land 37 on which the switching element 62 is mounted are not always required. Even in a case where the switching elements 61, 62 are wholly included in the heat radiation possible region R1, when the protruding portions 342, 372 are formed at positions where the forcing pressure is larger, the heat can be radiated with higher efficiency.

A part of a heat generation element may be included in the heat radiation possible region R1. In this case, a part of a land on which the heat generation element is mounted is included in the heat radiation possible region R1. Thus, a protruding portion is not always required. However, it is preferable that the protruding portion is formed so that the land is disposed at a position where the forcing pressure is larger.

The predetermined pressure defining the heat radiation possible region R1 is a pressure that can bring the semiconductor module 11 in close contact with the heat sink 7 via the heat radiation sheet 8 to a degree that enables heat radiation from the power supply relays 56, 57, the switching elements 61-66 and the motor relays 71-73 to the heat sink 7. For example, when the heat radiation sheet 8 includes an air layer, the predetermined pressure may be a pressure that can compress the air layer. The predetermined pressure depends on a flatness of the semiconductor module 11, a flatness of the heat sink 7, a configuration of the heat radiation sheet 8 and the like, and the predetermined pressure may be set appropriately.

As described above, the semiconductor device 10 according to the present embodiment includes the semiconductor module 11 and the pressing members 26, 27. The semiconductor module 11 includes the heat generation elements 56, 57, 61-66, 71-73 that generate heat by energization, the lands 31-41 each of which mounted with at least one of the heat generation elements 56, 57, 61-66, 71-73 is mounted, and the molding part 20 that integrally molds the heat generation elements 56, 57, 61-66, 71-73 and the lands 31-41.

The pressing members 26, 27 press the semiconductor module 11 to the heat sink 7. In the present embodiment, each of the lands 31, 32, 33, 35, 36, 38, 39, 40, 41 mounted with the heat generation elements 56, 57, 63-66, 71-73 disposed outside the heat radiation possible region R1 in which the forcing pressure by the pressing members 26, 27 is equal to or greater than the predetermined pressure has such a shape that a part of each of the lands 31, 32, 33, 35, 36, 38, 39, 40, 41 is included in the heat radiation possible region R1.

The heat generated by the heat generation elements 56, 57, 63-66, 71-73 disposed outside the heat radiation possible region R1 are transferred via the lands 31, 32, 33, 35, 36, 38, 39, 40, 41 on which the heat generation elements 56, 57, 63-66, 71-73 are mounted are radiated from the heat radiation possible region R1 to the heat sink 7. Because the heat generated by the heat generation elements 56, 57, 63-66, 71-73 disposed outside the heat radiation possible region R1 can be efficiently radiated, many heat generation elements 56, 57, 61-66, 71-73 can be disposed with respect to the pressing members 26, 27, and the semiconductor module 11 can be downsized. In addition, compared with a case where all of the heat generation elements 56, 57, 61-66, 71-73 are disposed in the heat radiation possible region R1, a flexibility of layout can be increased. Furthermore, the number of pressing members can be reduced, and the number of processes required for attaching the pressing members can be reduced.

The land 31 includes the base portion 311 on which the heat generation element 56 is mounted and the protruding portion 312 protruding from the end of the base portion 311 adjacent to the pressing member 26. Because the protruding portion 312 protrudes from the end of the base portion 311 adjacent to the pressing member 26 toward the pressing member 26, at least a part of the protruding portion 312 is included in the heat radiation possible region R1.

In a case where the protruding portion 312 is formed to protrude toward the pressing member 26, the protruding portion 312 can be disposed at a position where the forcing pressure by the pressing member 26 is larger. Thus, the heat generated by the heat generation element 56 can be radiated to the heat sink 7 via the land 31 with high efficiency. The same can be said of the other lands 32-41.

All of the lands 31-41 respectively include the protruding portions 312, 322, 332, 342, 352, 362, 372, 382, 392, 402, 412. In particular, the protruding portions 312, 322, 332, 342, 352 are disposed to surround the pressing member 26, and the protruding portions 362, 372, 382, 392, 402, 412 are disposed to surround the pressing member 27. Accordingly, many lands 31-41 can be disposed in the heat radiation possible region R1, and many heat generation elements 56, 57, 61-66, 71-73 can be disposed so as be capable of radiating heat.

In addition, the area of the protruding portion 312 in the land 31 is smaller than the area of the base portion 311. Because the area of the protruding portion 312 is reduced within a range of enabling heat radiation, many lands 31-41 can be disposed with respect to the pressing members 26, 27. Accordingly, many heat generation elements 56, 57, 61-66, 71-73 can be disposed with respect to the pressing members 26, 27 so as be capable of radiating heat, and the semiconductor module 11 can be downsized.

In the present embodiment, one heat generation element 56 is mounted in the base portion 311. Thus, the heat generated by the heat generation element 56 can be radiated with high efficiency. The same can be said of the other lands 31-41.

Second Embodiment

A semiconductor module 12 according to a second embodiment of the present disclosure will be described with reference to FIG. 5. The semiconductor module 12 is different from the semiconductor module 11 according to the first embodiment in shape of the lands. Regarding heat values of the switching elements 61-66 and the motor relays 71-73 forming the inverter section 60, in general, the heat values of the motor relays 71-73 are the largest, the heat values of the switching elements 61-63 disposed on the high potential side are next, and the heat values of the switching elements 64-66 disposed on the low-potential side are the smallest. Thus, in the present embodiment, the area of the protruding portions in the lands mounted with the heat generation elements having the large heat values is increased to increase the heat radiation efficiency.

Figure 5:
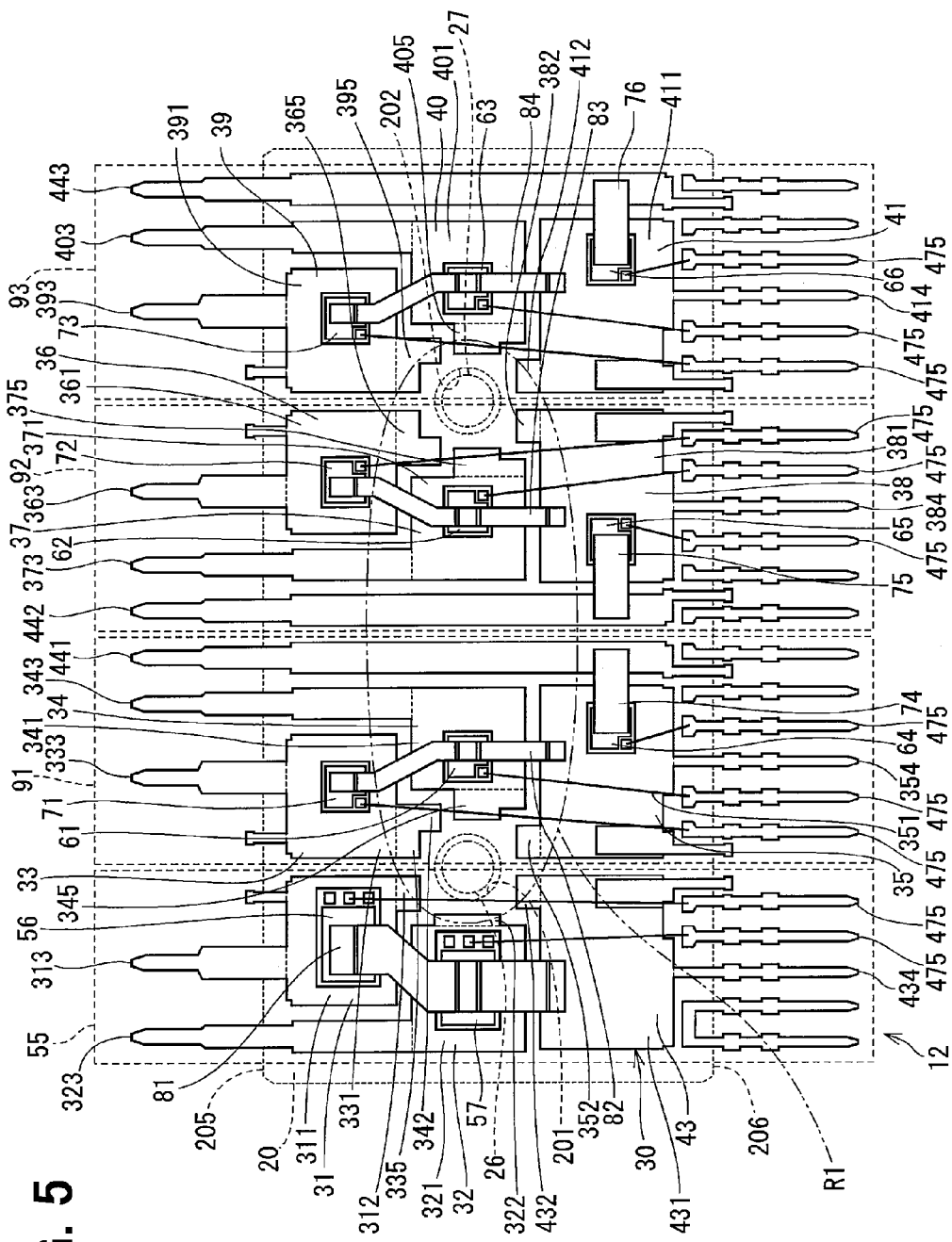
FIG. 5 is a plan view illustrating an internal configuration of a semiconductor module according to a second embodiment of the present disclosure.

As illustrated in FIG. 5, a protruding portion 335 in the land 33 on which the motor relay 71 is mounted protrudes from an end of the base portion 331 adjacent to the pressing member 26. In addition, a protruding portion 345 in the land 34 on which the switching element 61 is mounted protrudes from an end of the base portion 341 adjacent to the pressing member 26. The protruding portion 352 in the land 35 on which the switching element 64 is mounted is similar to the protruding portion 352 according to the first embodiment. Because the heat values of the motor relay 71, the switching element 61, and the switching element 64 decrease in this order, the areas of the protruding portions 335, 345, 352 decrease in this order.

Similarly, a protruding portion 365 in the land 36 on which the motor relay 72 is mounted protrudes from an end of the base portion 361 adjacent to the pressing member 27. In addition, a protruding portion 375 in the land 37 on which the switching element 62 is mounted protrudes from an end of the base portion 371 adjacent to the pressing member 27. The protruding portion 382 in the land 38 on which the switching element 65 is mounted is similar to the protruding portion 382 according to the first embodiment. Because the heat values of the motor relay 72, the switching element 62, and the switching element 65 decrease in this order, the areas of the protruding portions 365, 375, 382 decrease in this order.

Similarly, a protruding portion 395 in the land 39 on which the motor relay 73 is mounted protrudes from an end of the base portion 391 adjacent to the pressing member 27. A protruding portion 405 in the land 40 on which the switching element 63 is mounted protrudes from an end of the base portion 401 adjacent to the pressing member 27. The protruding portion 412 in the land 41 on which the switching element 66 is mounted is similar to the protruding portion 412 according to the first embodiment. Because the heat values of the motor relay 73, the switching element 63, and the switching element 66 decrease in this order, the areas of the protruding portions 395, 405, 412 decrease in this order.

In the present embodiment, each of the protruding portions 335, 345, 365, 375, 395, 405 has a stepped shape.

In the present embodiment, the areas of the protruding portions in the lands are set in accordance with the heat values of the heat generation elements mounted on the lands. Thus, the heat generated by the heat generation elements can be radiated with high efficiency. Furthermore, the same effects as the above-described embodiment can be obtained.

Third Embodiment

Figure 6:
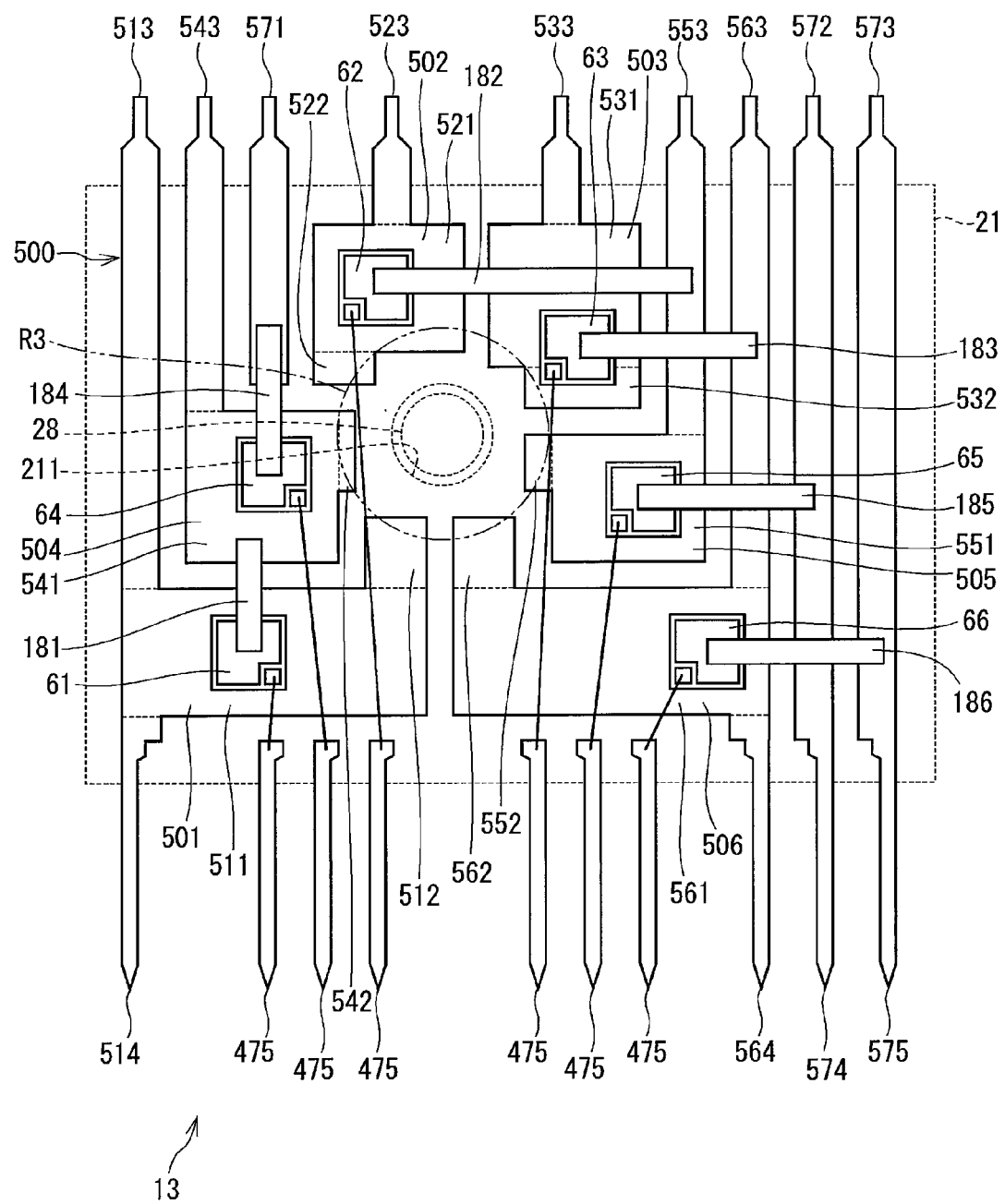
FIG. 6 is a plan view illustrating an internal configuration of a semiconductor module according to a third embodiment of the present disclosure.
Figure 7:
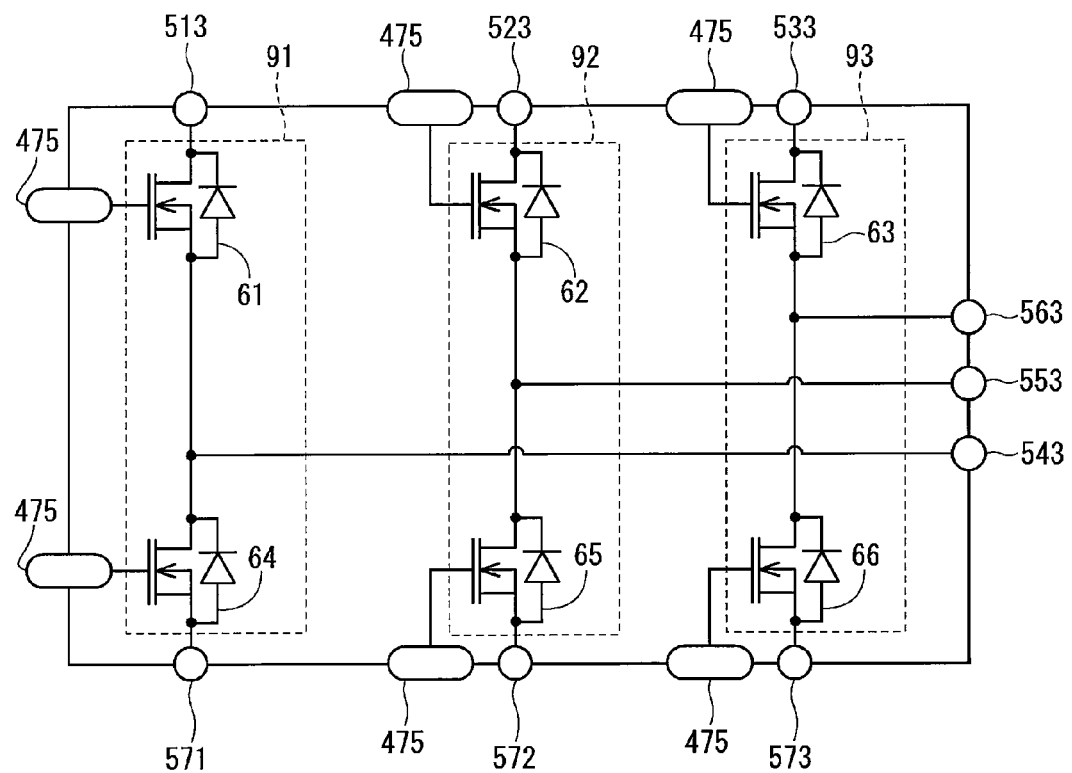
FIG. 7 is a circuit diagram illustrating a circuit configuration of the semiconductor module according to the third embodiment.

A semiconductor module 13 according to a third embodiment of the present disclosure will be described with reference to FIG. 6 and FIG. 7. As illustrated in FIG. 6, in the semiconductor module 13, the inverter section 60 is modulized as one module. The power supply relay section and the motor relay section may be modulized as other modules or may be omitted.

The semiconductor module 13 includes a lead frame 500 and a molding part 21 molding the lead frame 500. The lead frame 500 is made of material, such as copper plate, having a high electric conductivity and a high thermal conductivity. The semiconductor module 13 is formed into a plate shape as a whole. The molding part 21 has an insertion hole 211. The semiconductor module 13 is fixed to the heat sink 7 with one pressing member 28 inserted into the insertion hole 211. The pressing member 28 is, for example, a screw similarly to the pressing members 26, 27.

The lead frame 500 includes lands 501-506 as conductive members. In the present embodiment, the lands 501-506 are disposed around the pressing member 28. The land 501 includes a base portion 511, a protruding portion 512, a power terminal 513, and a control terminal 514. The switching element 61 is mounted on the base portion 511. The land 503 includes a base portion 521, a protruding portion 522, and a power terminal 523. The switching element 62 is mounted on the base portion 521. A land 503 includes a base portion 531, a protruding portion 532, and a power terminal 533. The switching element 63 is mounted so as to straddle the base portion 531 and the protruding portion 532.

The land 504 includes a base portion 541, a protruding portion 542, and a power terminal 543. The switching element 64 is mounted on the base portion 541. The land 505 includes a base portion 551, a protruding portion 552, and a power terminal 553. The switching element 65 is mounted on the base portion 551. The land 506 includes a base portion 561, a protruding portion 562, a power terminal 563, and a control terminal 564. The switching element 65 is mounted on the base portion 561.

The base portion 511 in the land 501 has a substantially rectangular shape, and the protruding portion 512 protrudes from an end of the base portion 511 adjacent o the pressing member 26. An area of the protruding portion 512 is smaller than an area of the base portion 511. The same can be said of the other lands 502-506.

The power terminals 513, 523, 533 are connected to the high-potential side of the battery 50 via the power substrate 3. The power terminal 543 is connected to the U-phase winding of the motor 5 via the power substrate 3. The power terminal 553 is connected to the V-phase winding of the motor 5 via the power substrate 3. The power terminal 563 is connected to the W-phase winding of the motor 5 via the power substrate 3.

The source of the switching element 61 is connected to the land 504 by a wiring member 181. The source of the switching element 62 is connected to the power terminal 553 in the land 505 via a wiring member 182. The source of the switching element 63 is connected to the power terminal 563 in the land 506 via a wiring member 183.

The source of the switching element 64 is connected to a ground terminal 571 by a shunt resistor 184. The source of the switching element 65 is connected to a ground terminal 572 by a shunt resistor 185. The source of the switching element 66 is connected to a ground terminal 572 by a shunt resistor 186. The ground terminals 571-573 are connected to the ground via the power substrate 3. The ground terminals 572, 573 are integrally formed with control terminals 574, 575. The control terminals 514, 564, 574, 575 are connected to the control substrate 4.

In the present embodiment, switching elements 61-66 forming the inverter section 60 are heat generation elements. At least a part of each of the lands 501-506 on which the switching elements 61-66 are mounted is included in a heat radiation possible region R3 in which a forcing pressure by the pressing member 28 is equal to or greater than a predetermined pressure. In the present embodiment, the number of pressing member 28 for fixing the semiconductor module 13 to the heat sink 7 is one. Thus, the heat radiation possible region R3 is a substantially circular region. The heat generated by switching of the switching elements 61-66, which form the inverter section 60, is radiated from the heat radiation possible region R3 corresponding to the one pressing member 28. Accordingly, the heat generated by the switching elements 61-66 can be efficiently radiated. In addition, the semiconductor module 13 forming the inverter section 60 can be downsized. Furthermore, the same effects as the above-described embodiments can be obtained.

Fourth Embodiment

Figure 8:
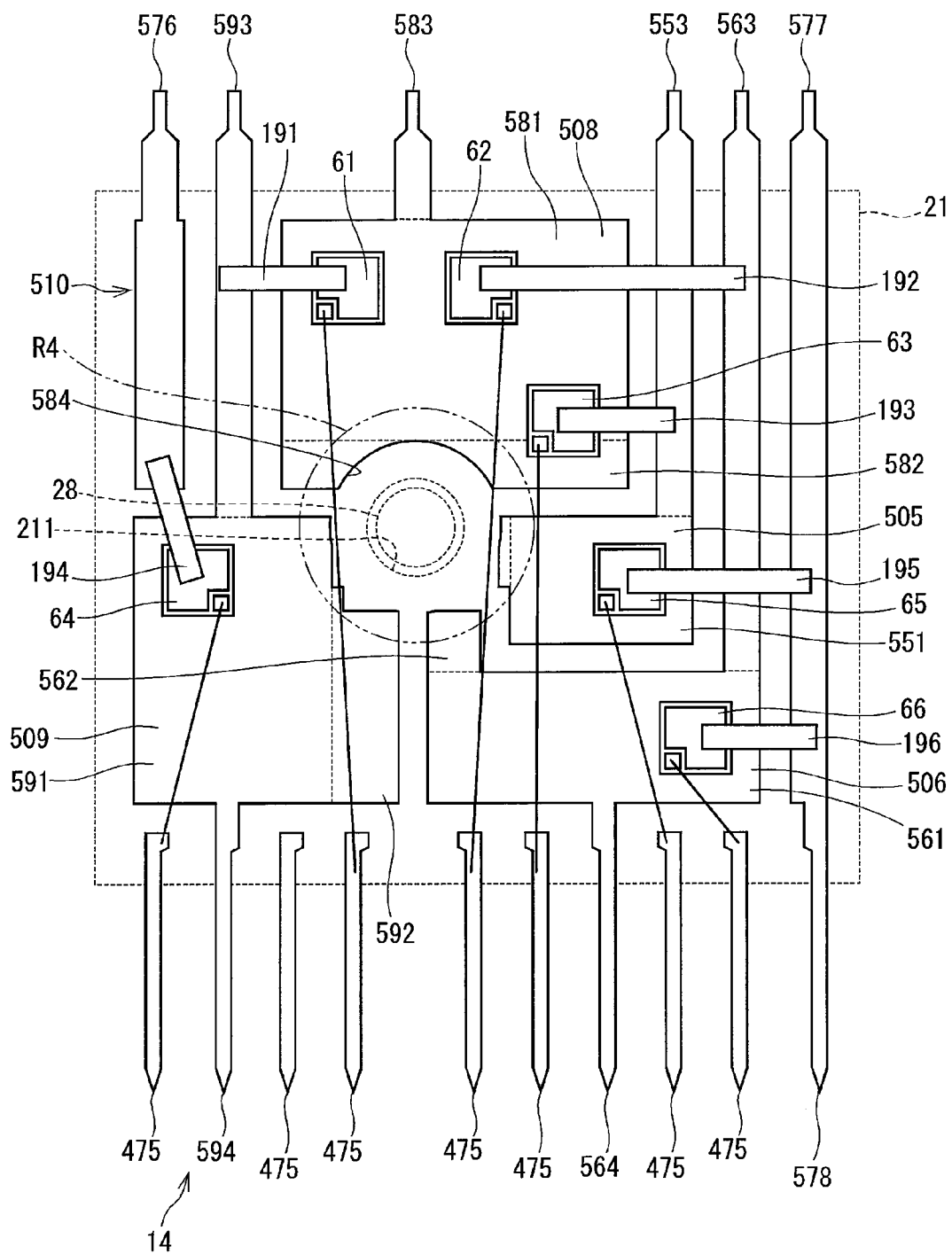
FIG. 8 is a plan view illustrating an internal configuration of a semiconductor module according to a fourth embodiment of the present disclosure.
Figure 9:
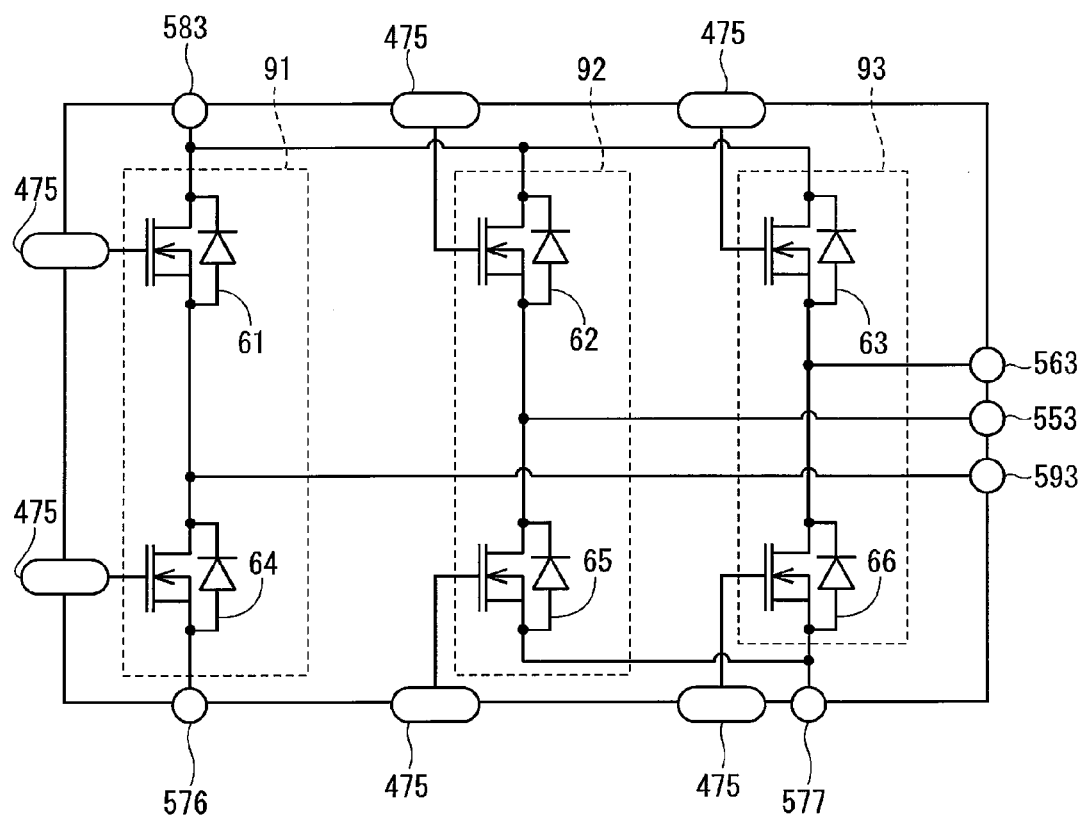
FIG. 9 is a circuit diagram illustrating a circuit configuration of the semiconductor module according to the fourth embodiment.

A semiconductor module 14 according to a fourth embodiment of the present disclosure will be described with reference to FIG. 8 and FIG. 9. The present embodiment is a modification of the third embodiment. A land 508 is provided instead of the lands 501-503 and a land 509 is provided instead of the land 504. The other lands 505, 506 are similar to the lands 505, 506 according to the third embodiment. As illustrated in FIG. 8, a lead frame 510 in the semiconductor module 14 includes the lands 505, 506, 508, 509. The lands 505, 506, 508, 509 are disposed around the pressing member 28.

The land 508 includes a base portion 581, a protruding portion 582, and a power terminal 583. The switching elements 61-63 are mounted on the land 508. Specifically, the switching elements 61, 62 are mounted on the base portion 581, and the switching element 63 is mounted so as to straddle the base portion 581 and the protruding portion 582. In the present embodiment, the drains of the switching elements 61-63 are at the same potential. Thus, the switching elements 61-63 are mounted on the one land 508. The protruding portion 582 is formed by providing an arc-shaped cut-out portion 584 at an end of the land 508 adjacent to the pressing member 28. The land 509 includes a base portion 591, a protruding portion 592, a power terminal 593, and a control terminal 594. The switching element 64 is mounted on the base portion 591.

The base portion 581 in the land 508 has a substantially rectangular shape, and the protruding portion 582 protrudes from an end of the base portion 581 adjacent to the pressing member 28. An area of the protruding portion 582 is smaller than an area of the base portion 581. The same can be said of the land 509.

The power terminal 583 is connected to the high-potential side of the battery 50 via the power substrate 3. The power terminal 593 is connected to the U-phase winding of the motor 5 via the power substrate 3. The source of the switching element 61 is connected to the power terminal 593 in the land 509 by a wiring member 191. The source of the switching element 62 is connected to the power terminal 553 in the land 505 by a wiring member 192. The source of the switching element 63 is connected to the power terminal 563 in the land 506 by a wiring member 193.

The source of the switching element 63 is connected to a ground terminal 576 by a shunt resistor 194. The source of the switching element 65 is connected to a ground terminal 577 by a shunt resistor 195. The source of the switching element 66 is connected to the ground terminal 577 by a shunt resistor 196. The ground terminals 576, 577 are connected to the ground via the power substrate 3. The switching elements 65, 66 share the ground terminal 577. The ground terminal 577 is integrally formed with a control terminal 578. The control terminals 578, 594 are connected to the control substrate 4.

At least a part of each of the lands 505, 506, 508, 509 on which the switching elements 61-66 are mounted is included in a heat radiation possible region R4 in which a forcing pressure by the pressing member 28 is equal to or greater than a predetermined pressure. In the present embodiment, more than one heat generation elements 61-63 are mounted on the land 508. Accordingly, the semiconductor module 14 can be downsized. In addition, the number of terminals can be reduced. Furthermore, the same effects as the above-described embodiments can be obtained.

Fifth Embodiment

Figure 10:
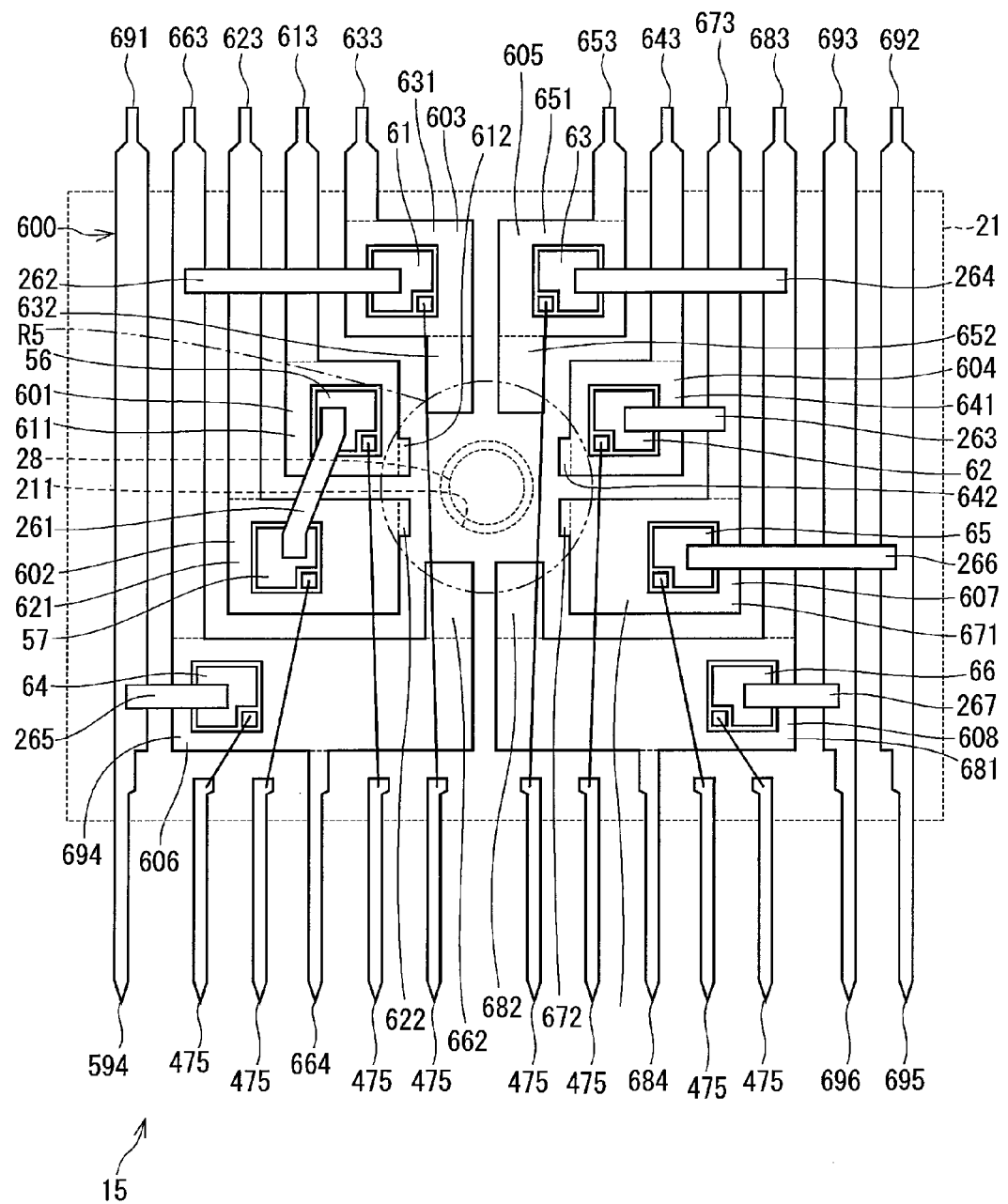
FIG. 10 is a plan view illustrating an internal configuration of a semiconductor module according to a fifth embodiment of the present disclosure.
Figure 11:
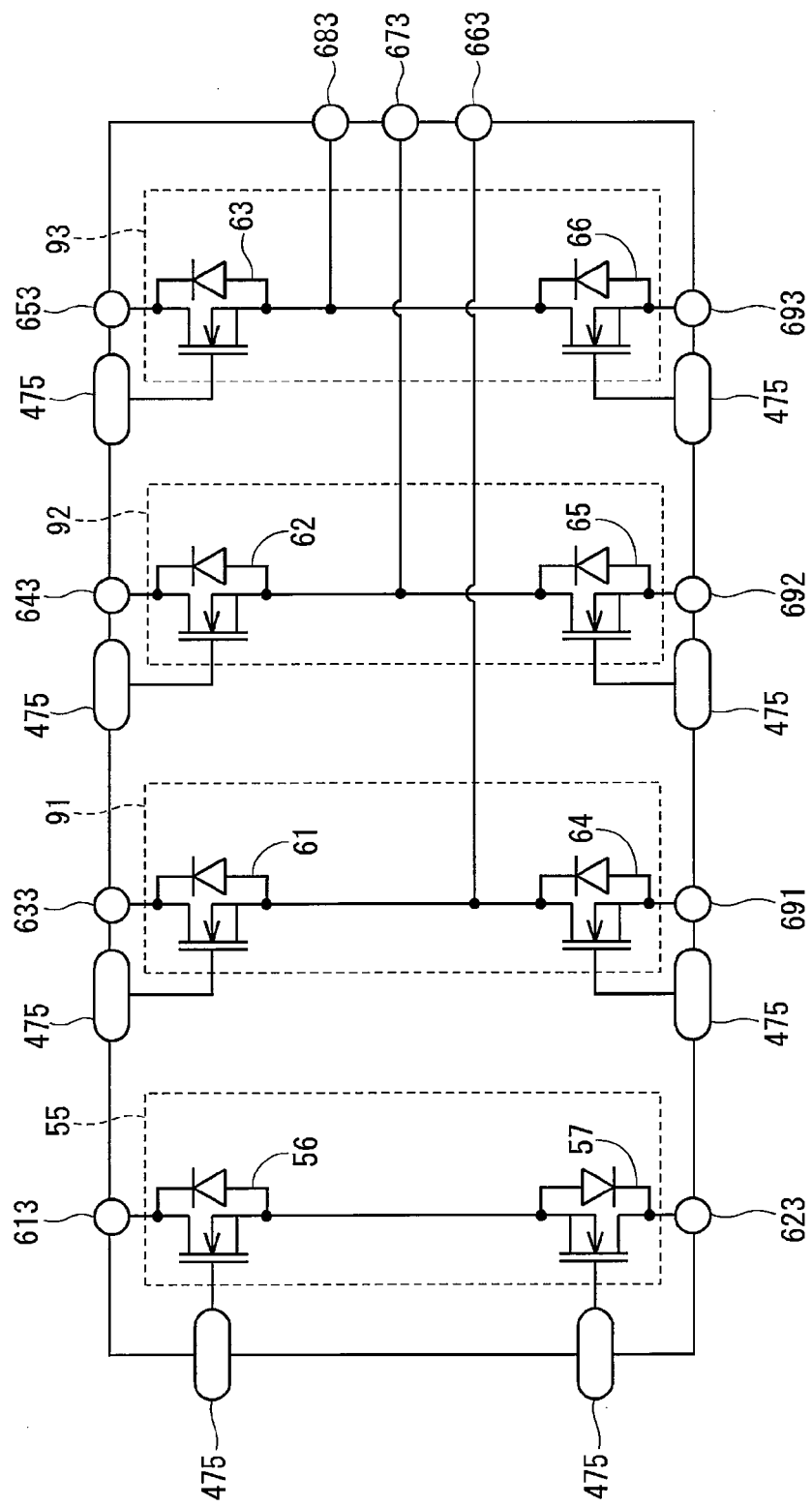
FIG. 11 is a circuit diagram illustrating a circuit configuration of the semiconductor module according to the fifth embodiment.

A semiconductor module 15 according to a fifth embodiment of the present disclosure will be described with reference to FIG. 10 and FIG. 11. As illustrated in FIG. 10, in the semiconductor module 15, the power supply relay section 55 and the inverter section 60 are modulized as one module. The motor relay section may be modulized as other module or may be omitted. A lead frame 600 in the semiconductor module 15 includes lands 601-608.

The land 601 includes a base portion 611, a protruding portion 612, and a power terminal 613. The power supply relay 56 is mounted on the base portion 611. The land 602 includes a base portion 621, a protruding portion 622, and a power terminal 623. The power supply relay 57 is mounted on the base portion 621.

The land 603 includes a base portion 631, a protruding portion 632, and a power terminal 633. The switching element 61 is mounted on the base portion 631. The land 604 includes a base portion 641, a protruding portion 642, and a power terminal 643. The switching element 62 is mounted on the base portion 541. The land 605 includes a base portion 651, a protruding portion 652, and a power terminal 653. The switching element 63 is mounted on the base portion 651.

The land 606 includes a base portion 661, a protruding portion 662, a power terminal 663, and a control terminal 664. The switching element 64 is mounted on the base portion 661. The land 607 includes a base portion 671, a protruding portion 672, and a power terminal 673. The switching element 65 is mounted on the base portion 671. The land 608 includes a base portion 681, a protruding portion 682, a power terminal 683, and a control terminal 684. The switching element 66 is mounted on the base portion 681.

The base portion 612 in the land 601 has a substantially rectangular shape, and the protruding portion 612 protrudes from an end of the base portion 611 adjacent to the pressing member 28. An area of the protruding portion 612 is smaller than an area of the base portion 611. The same can be said of the other lands 602-608.

The source of the power supply relay 56 and the source of the power supply relay 57 are connected by a wiring member 261. The source of the switching element 61 is connected to the power terminal 673 in the land 607 on which the switching element 65 is mounted by a wiring member 262. The source of the switching element 62 is connected to the power terminal 673 in the land 606 on which the switching element 64 is mounted by a wiring member 263. The source of the switching element 63 is connected to the power terminal 683 in the land 608 on which the switching element 66 is mounted by a wiring member 264.

The source of the switching element 64 is connected to a ground terminal 691 by a shunt resistor 265. The source of the switching element 65 is connected to a ground terminal 692 by a shunt resistor 266. The source of the switching element 66 is connected to a ground terminal 693 by a shunt resistor 267. The ground terminals 691-693 are connected to the ground via the power substrate 3. The ground terminals 691-693 are integrally formed with the control terminals 694-696, respectively.

The power terminal 613 is connected to the high-potential side of the battery 50 via the power substrate 3. The power terminal 623 is connected to the inverter section 60. The power terminals 633, 643, 653 are connected to the power supply relay section 55 via the power substrate 3. The ground terminals 691-693 are connected to the ground via the power substrate 3. The power terminal 663 is connected to the U-phase winding of the motor 5 via the power substrate 3. The power terminal 673 is connected to the V-phase winding of the motor 5 via the power substrate 3. The power terminal 683 is connected to the W-phase winding of the motor 5 via the power substrate 3. The control terminals 664, 684, 694-696 are connected to the control substrate 4.

In the present embodiment, the switching elements 61-66 forming the inverter section 60 and the power supply relays 56, 57 connected between the inverter section 60 and the battery 50 are heat generation elements. Each of the lands 601-608 on which the switching elements 61-66 and the power supply relays 56, 57 are mounted has such a shape that at least a part of each of the lands 601-608 is included in a heat radiation possible region R5 corresponding to the one pressing member 28.

In the present embodiment, the heat generated by switching of the switching elements 61-66, which form the inverter section 60, and the power supply relays 56, 57 is radiated from the heat radiation possible region R5 corresponding to the one pressing member 28. Accordingly, the heat generated by the switching elements 61-66 and the power supply relays 56, 57 can be efficiently radiated. In addition, the semiconductor module 15 can be downsized. Furthermore, the same effects as the above-described embodiments can be obtained.

Sixth Embodiment

Figure 12:
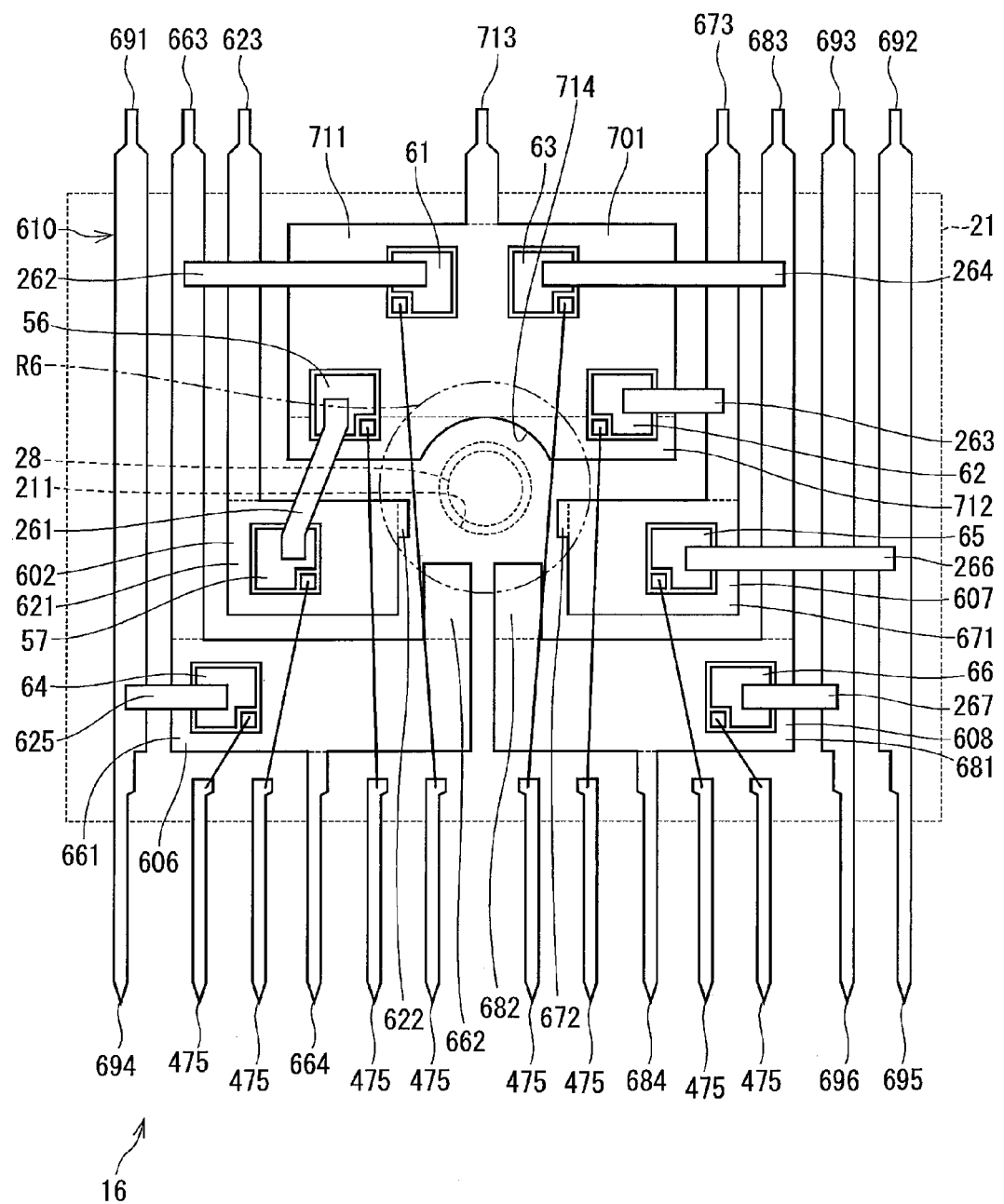
FIG. 12 is a plan view illustrating an internal configuration of a semiconductor module according to a sixth embodiment of the present disclosure.
Figure 13:
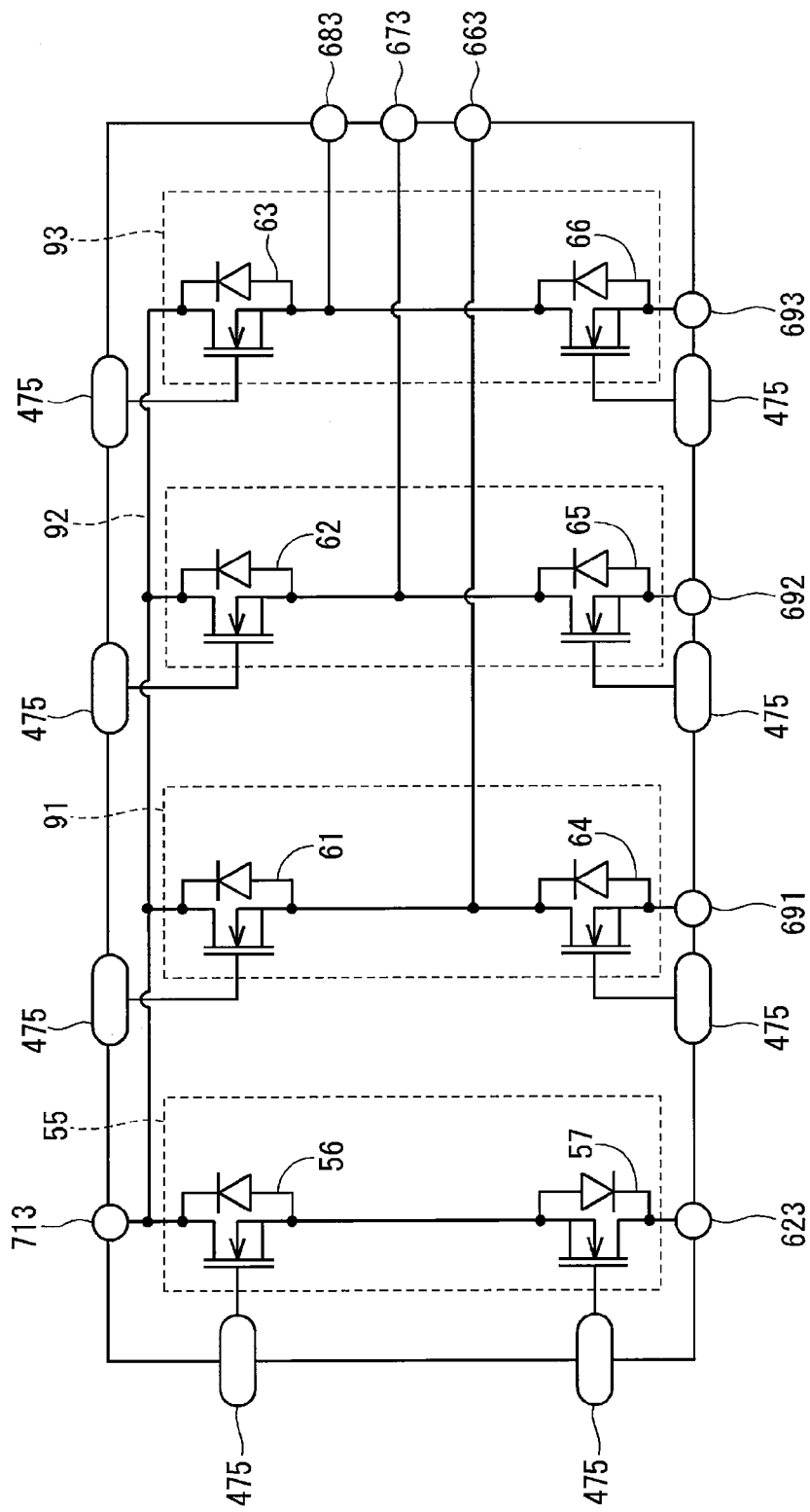
FIG. 13 is a circuit diagram illustrating a circuit configuration of the semiconductor module according to the sixth embodiment.

A semiconductor module 16 according to a sixth embodiment of the present disclosure will be described with reference to FIG. 12 and FIG. 13. The present embodiment is a modification of the fifth embodiment, and a land 701 is provided instead of the lands 601, 603, 604, 605. The other lands 602, 606-608 are similar to the lands 602, 606-608 according to the fifth embodiment. As illustrated in FIG. 12, a lead frame 610 in the semiconductor module 16 includes the lands 602, 606, 607, 608, 701. The lands 602, 606, 607, 608, 701 are disposed around the pressing member 28.

The land 701 includes a base portion 711, a protruding portion 712, and a power terminal 713. The power supply relay 56 and the switching elements 61-63 are mounted on the land 701. Specifically, the switching elements 61, 63 are mounted on the base portion 711, and the power supply relay 56 and the switching element 62 are disposed so as to straddle the base portion 711 and the protruding portion 712. Because the drains of the power supply relay 56 and the switching elements 61-63 are at the same potential, the power supply relay 56 and the switching elements 61-63 are mounted on the one land 701. The protruding portion 712 is formed by providing an arc-shaped cut-out portion 714 at an end of the land 701 adjacent to the pressing member 28.

The base portion 711 in the land 701 has a substantially rectangular shape, and the protruding portion 712 protrudes from an end of the base portion 711 adjacent to the pressing member 28. The power terminal 713 is connected to the high-potential side of the battery 50 via the power substrate 3.

At least a part of each of the lands 602, 606, 607, 608, 609, 701 on which the power supply relays 56, 57 and the switching elements 61-66 are mounted is included in a heat radiation possible region R6 in which a forcing pressure by the pressing member 28 is equal to or greater than a predetermined pressure. In the present embodiment, more than one heat generation elements 56, 61-63 are mounted on the land 701. Accordingly, the semiconductor module 16 can be downsized. In addition, the number of terminals can be reduced. Furthermore, the same effects as the above-described embodiments can be obtained.

Seventh Embodiment

A semiconductor module 17 according to a seventh embodiment of the present disclosure will be described with reference to FIG. 14 and FIG. 15. The semiconductor module 17 is applied to a motor 6 with brush as a load. As illustrated in FIG. 15, an inverter section 160 includes four switching elements 161-164 forming an H bridge circuit. The switching elements 161, 162 are disposed to a high-potential side of the H bridge circuit. The switching elements 163, 164 are disposed to a low-potential side of the H bridge circuit.

A motor relay section 170 includes motor relays 171, 172 as load relays. The motor relay 171 is connected between a connection point of the switching elements 161, 163 and a winding of the motor 6. The motor relay 172 is connected between a connection point of the switching elements 162, 164 and the winding of the motor 6. The power supply relay section 55 is similar to the power supply relay section 55 according to the first embodiment and is disposed between the battery 50 and the inverter section 160.

Each of the switching elements 161-164 and the motor relays 171, 172 is a MOSFET similarly to the power supply relays 56, 57. In the present embodiment, the power supply relays 56, 57, the switching elements 161-164, and the motor relays 171, 172 are heat generation elements.

Figure 14:
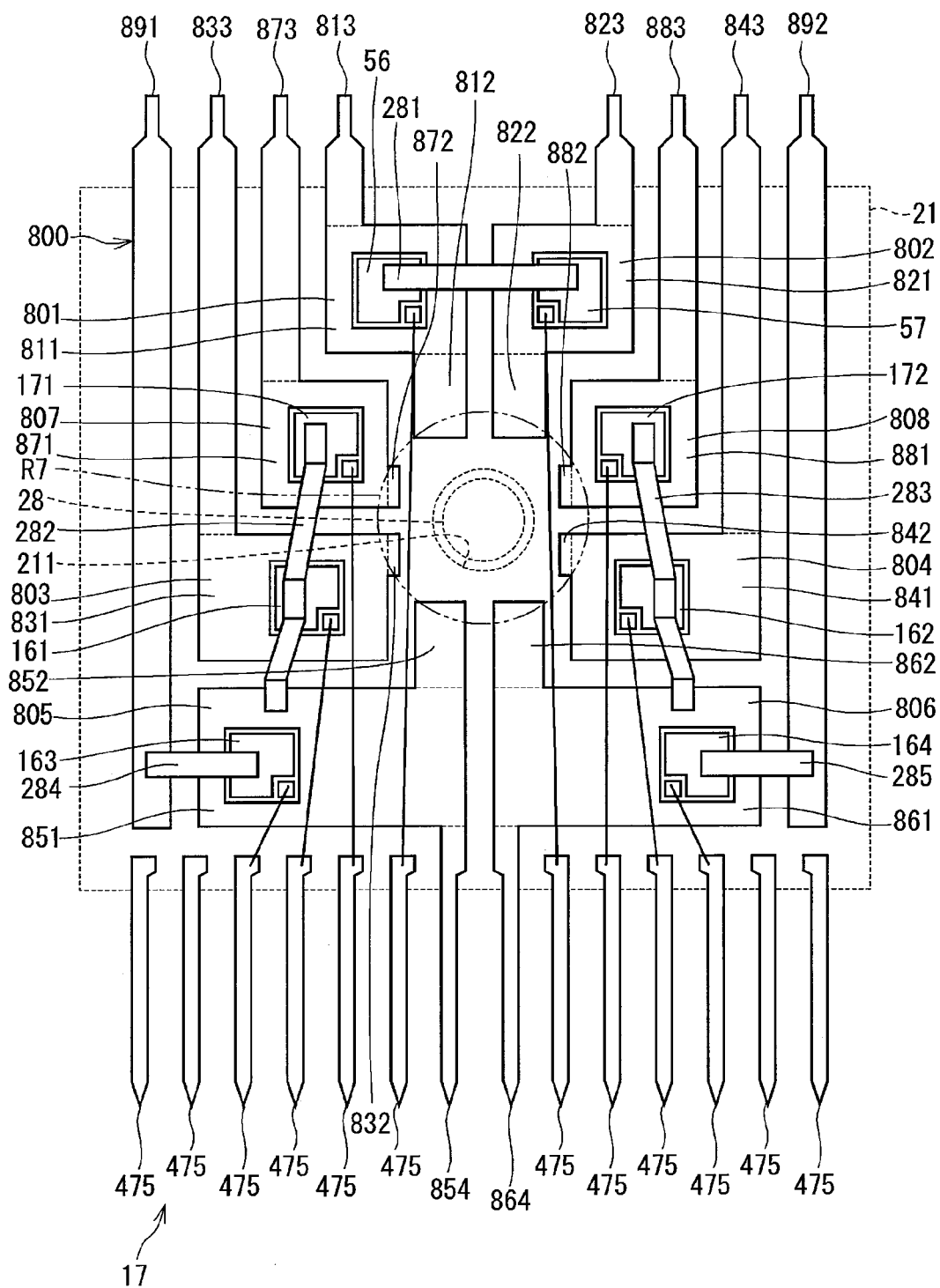
FIG. 14 is a plan view illustrating an internal configuration of a semiconductor module according to a seventh embodiment of the present disclosure.
Figure 15:
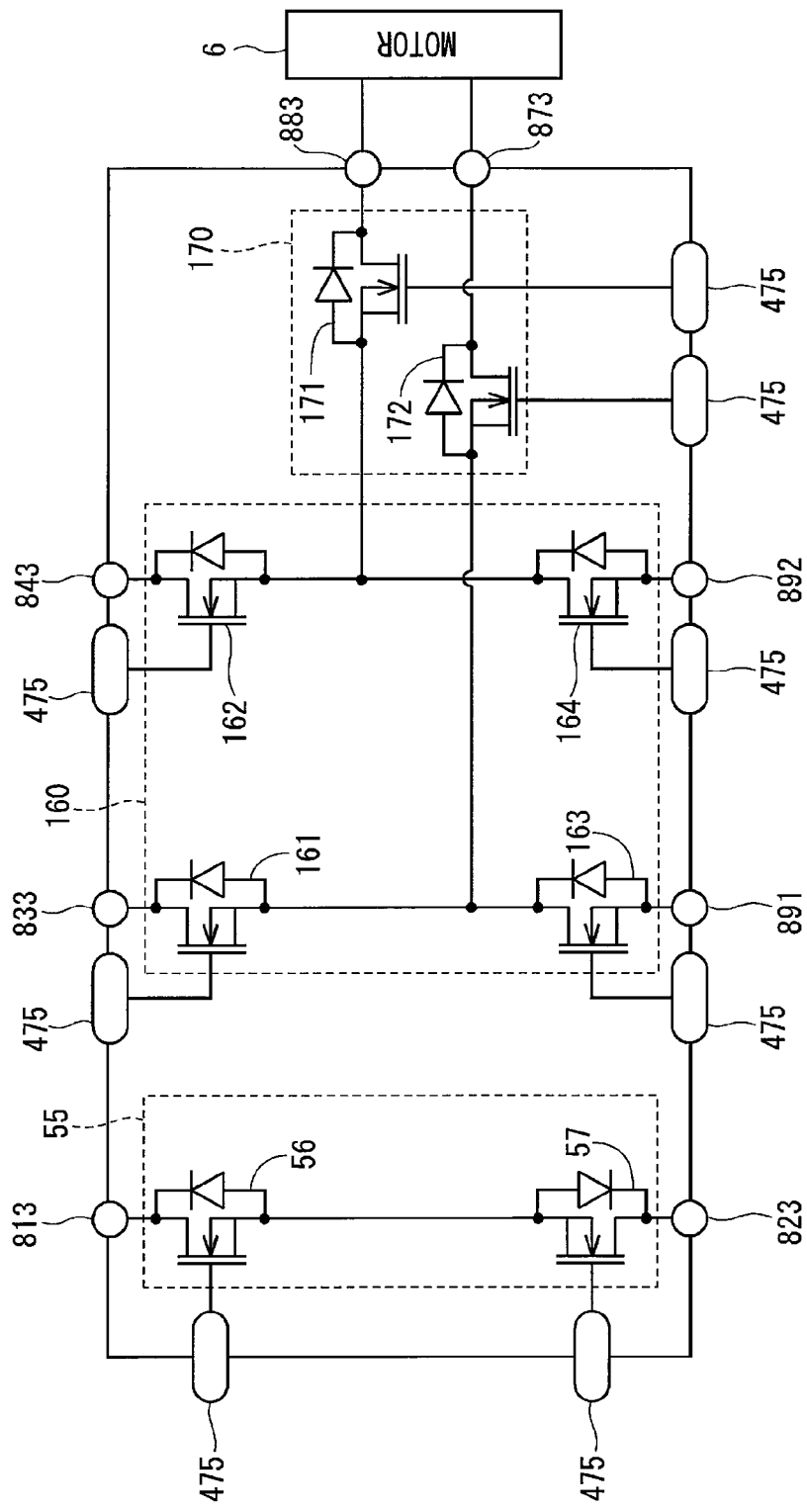
FIG. 15 is a circuit diagram illustrating a circuit configuration of the semiconductor module according to the seventh embodiment.

As illustrated in FIG. 14, a lead frame 800 in the semiconductor module 17 includes lands 801-808. The land 801 includes a base portion 811, a protruding portion 812, and a power terminal 813. The power supply relay 56 is mounted on the base portion 811. The land 802 includes a base portion 821, a protruding portion 822, and a power terminal 823. The power supply relay 57 is mounted on the base portion 821.

The land 803 includes a base portion 831, a protruding portion 832, and a power terminal 833. The switching element 161 is mounted on the base portion 831. The land 804 includes a base portion 841, a protruding portion 842, and a power terminal 843. The switching element 162 is mounted on the base portion 841. The land 805 includes a base portion 851, a protruding portion 852, and a control terminal 854. The switching element 163 is mounted on the base portion 851. The land 806 includes a base portion 861, a protruding portion 862, and a control terminal 864. The switching element 164 is mounted on the base portion 861.

The land 807 includes a base portion 871, a protruding portion 872, and a power terminal 873. The motor relay 171 is mounted on the base portion 871. The land 808 includes a base portion 881, a protruding portion 882, and a power terminal 883. The motor relay 172 is mounted on the base portion 881.

The base portion 811 in the land 801 has a substantially rectangular shape, and the protruding portion 812 protrudes from an end of the base portion 811 adjacent to the pressing member 28. An area of the protruding portion 812 is smaller than an area of the base portion 811. The same can be said of the other lands 802-808.

The source of the power supply relay 56 and the source of the power supply relay 57 are connected by a wiring member 281. The source of the motor relay 171, the source of the switching element 161 and the land 805 are connected by a wiring member 282. The source of the motor relay 172, the source of the switching element 162, and the land 806 are connected by a wiring member 283. The source of the switching element 163 is connected to a ground terminal 891 by a wiring member 284. The source of the switching element 164 is connected to a ground terminal 892 by a wiring member 285.

The power terminal 813 is connected to the high-potential side of the battery 50. The power terminals 833, 843 are connected to the power supply relay section 55. The power terminals 873, 883 are connected to the winding of the motor 6. The ground terminals 891, 892 and the power terminal 823 are connected to the ground. The control terminals 854, 864 are connected to the control substrate 4.

In the present embodiment, the switching elements 161-164 forming the inverter section 160, the power supply relays 56, 57 connected between the inverter section 160 and the battery 50, and the motor relays 171, 172 connected between the inverter section 160 and the motor 6 are heat generation elements. Each of the lands 801-808 on which the switching elements 161-164, the power supply relays 56, 57, and the motor relays 171, 172 are mounted has such a shape that at least a part of each of the lands 801-808 is included in a heat radiation possible region R7 corresponding to the one pressing member 28.

In the present embodiment, the heat generated by switching of the switching elements 161-166, which form the inverter section 160, the power supply relays 56, 57, and the motor relays 171, 172 is radiated from the heat radiation possible region R7 corresponding to the one pressing member 28. Accordingly, the heat generated by the switching elements 161-166, the power supply relays 56, 57, and the motor relays 171, 172 can be efficiently radiated. In addition, the semiconductor module 17 can be downsized. Accordingly, the same effects as the above-described embodiments can be obtained.

Eighth Embodiment

A semiconductor module 18 according to an eighth embodiment of the present disclosure will be described with reference to FIG. 16 and FIG. 17. The semiconductor module 18 is applied to the motor 6 with brush similarly to the seventh embodiment. As illustrated in FIG. 17, the present embodiment is different from the seventh embodiment in that the motor relay section is omitted. The motor relay section may be modulized as other module or may be omitted.

Figure 16:
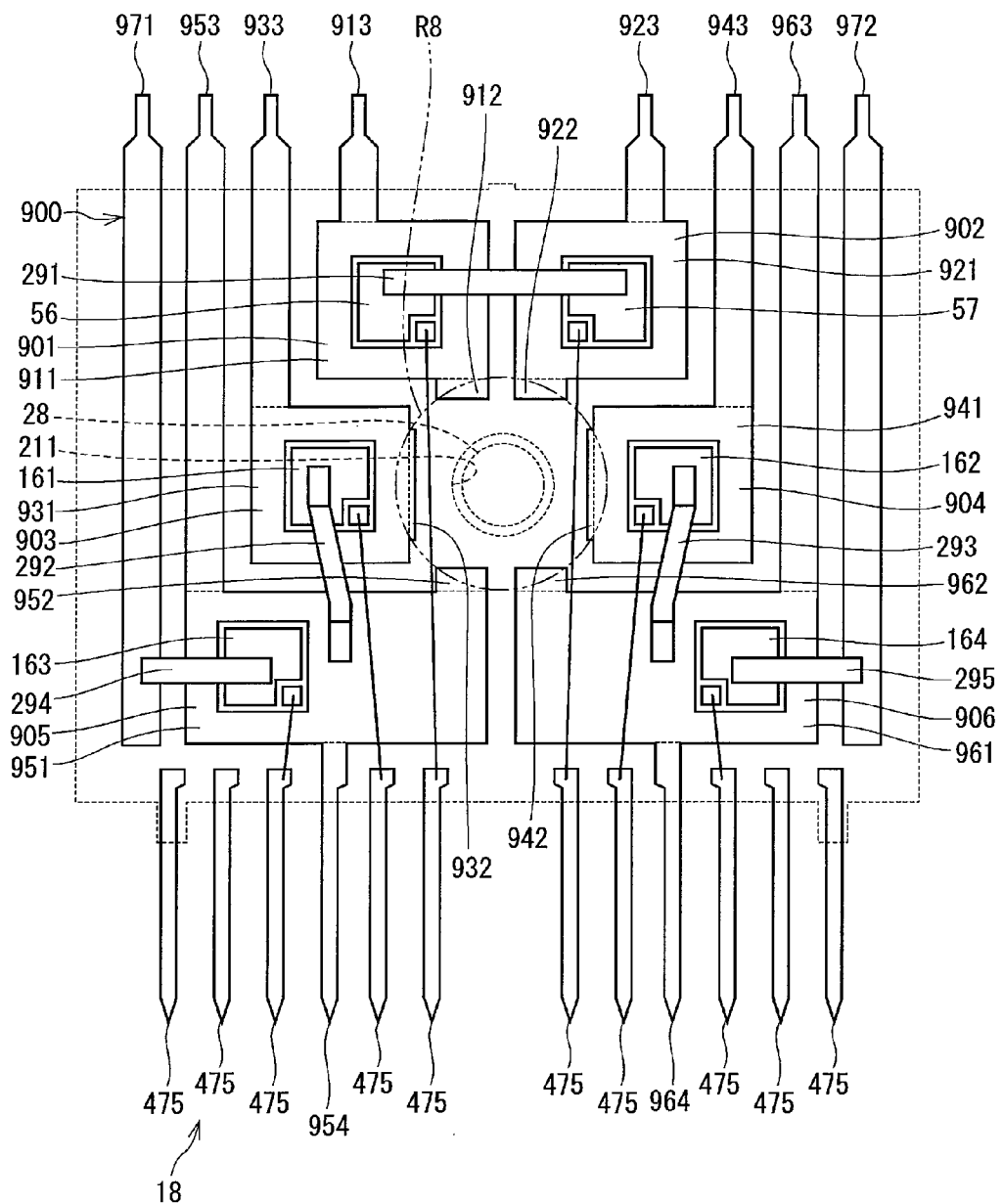
FIG. 16 is a plan view illustrating an internal configuration of a semiconductor module according to an eighth embodiment of the present disclosure.
Figure 17:
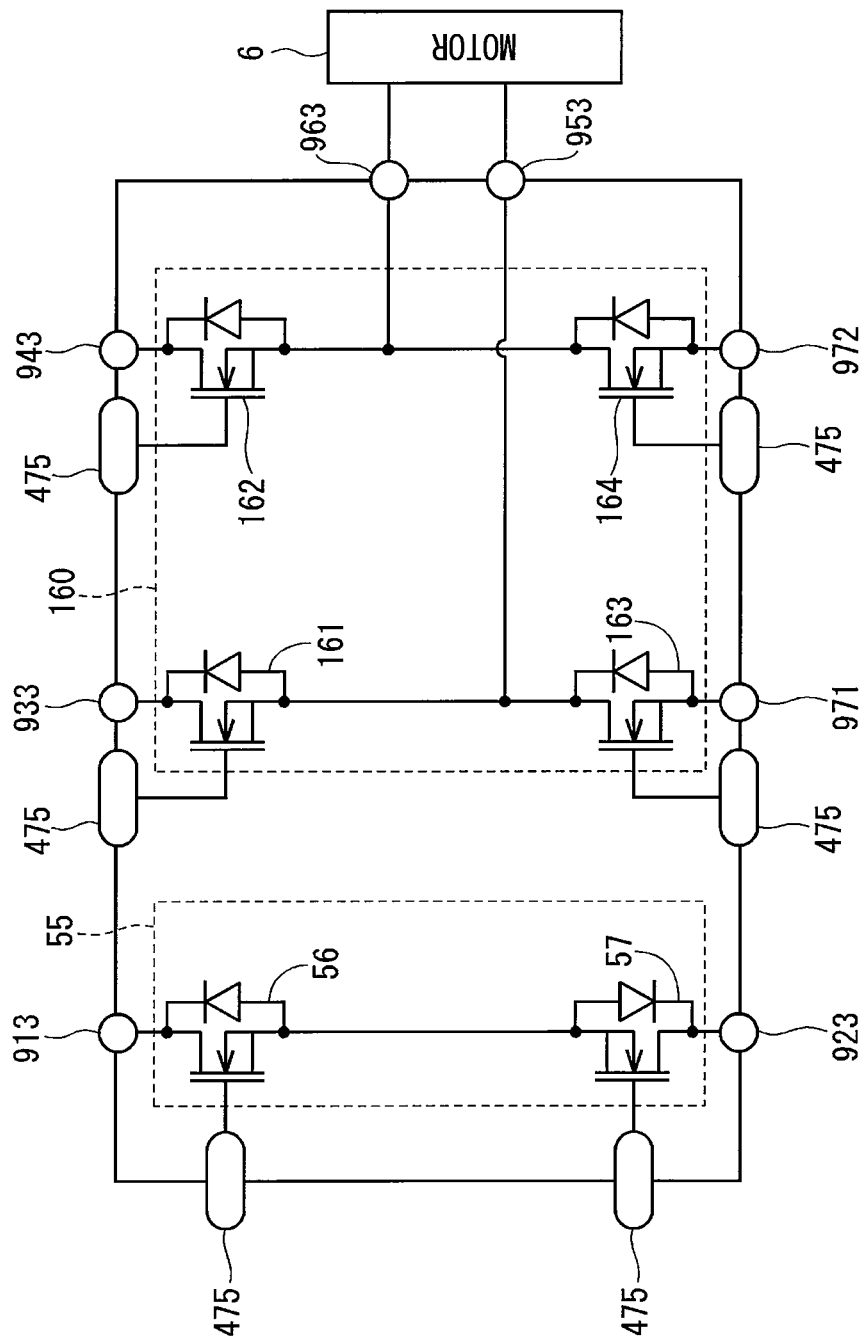
FIG. 17 is a circuit diagram illustrating a circuit configuration of the semiconductor module according to the eighth embodiment.

As illustrated in FIG. 16, a lead frame 900 in the semiconductor module 18 includes lands 901-906. The land 901 includes a base portion 911, a protruding portion 912, and a power terminal 913. The power supply relay 56 is mounted on the base portion 911. The land 902 includes a base portion 921, a protruding portion 922, and a power terminal 923. The power supply relay 57 is mounted on the base portion 921.

The land 903 includes a base portion 931, a protruding portion 932, and a power terminal 933. The switching element 161 is mounted on the base portion 931. The land 904 includes a base portion 941, a protruding portion 942, and a power terminal 943. The switching element 162 is mounted on the base portion 941. The land 905 includes a base portion 951, a protruding portion 952, a power terminal 953, and a control terminal 954. The switching element 163 is mounted on the base portion 951. The land 906 includes a base portion 961, a protruding portion 962, a power terminal 963, and a control terminal 964. The switching element 164 is mounted on the base portion 961.

The protruding portion 912 in the land 901 protrudes from an end of the base portion 911 adjacent to the pressing member 28. An area of the protruding portion 912 is smaller than an area of the base portion 911. The same can be said of the other lands 902-906.

The source of the power supply relay 56 and the source of the power supply relay 57 are connected by a wiring member 291. The source of the switching element 161 and the land 905 are connected by a wiring member 292. The source of the switching element 162 and the land 906 are connected by a wiring member 293. The source of the switching element 163 is connected to a ground terminal 971 by a wiring member 294. The source of the switching element 164 is connected to a ground terminal 972 by a wiring member 295.

The power terminal 913 is connected to the high-potential side of the battery 50. The power terminals 933, 943 are connected to the power supply relay section 55. The power terminals 953, 963 are connected to the winding of the motor 6. The ground terminals 971, 972 and the power terminal 923 are connected to the ground. The control terminals 954, 964 are connected to the control substrate 4.

In the present embodiment, the switching elements 161-166 forming the inverter section 160 and the power supply relays 56, 57 connected between the inverter section 160 and the battery 50 are heat generation elements. Each of the lands 901-906 on which the switching elements 161-164 and the power supply relays 56, 57 are mounted has such a shape that at least a part of each of the lands 901-906 is included in a heat radiation possible region R8 corresponding to the one pressing member 28.

In the present embodiment, the heat generated by switching of the switching elements 161-166, which form the inverter section 160, and the power supply relays 56, 57 is radiated from the heat radiation possible region R8 corresponding to the one pressing member 28. Accordingly, the heat generated by the switching elements 161-164 and the power supply relays 56, 57 can be efficiently radiated. In addition, the semiconductor module 18 can be downsized. Furthermore, the same effects as the above-described embodiments can be obtained.

Other Embodiments

The arrangement of the switching elements, which form each of the phase circuits in the inverter section, the power supply relay section, and the motor relay section, the shapes of the lead frames, and the like are not limited to the arrangement and the shapes of the above-described embodiments. In the above-described embodiments, the protruding portions are mainly formed into the substantially rectangular shapes. The protruding portions in the second embodiment are formed into the stepped shape, and the protruding portions in the fourth and sixth embodiments are formed to have arc-shaped portions. However, the protruding portions in another embodiment may have any shapes. In the above-described embodiments, the base portions are formed into the substantially rectangular shapes. However the base portions in another embodiment may have any shapes.

In the above-described embodiments, the pressing members are screws. In another embodiment, a pressing member may have other configuration, such as a spring. In the present case, a molding part does not have an insertion hole. In a case where the pressing member is formed of the spring, it is preferable to press a portion of a semiconductor module at which the screw is disposed in the above-described embodiments and not to press the whole area of the semiconductor module. In this case, a design of the spring can be simplified compared with a case where the whole area of the semiconductor module is pressed. Considering reliability of the heat generation elements, it is preferable to dispose the heat generation elements at positions at a predetermined distance from a position where a forcing pressure by the spring directly acts.

In the above-described embodiments, five, six, or eight lands are provided with respect to one pressing member. In another embodiment, the number of lands provided with respect to one pressing member may be any number of three or more.

In the above-described embodiments, one, three, or four heat generation elements are mounted on one land as the conductive member. In another embodiment, the number of heat generation elements mounted on one land may be any.

For example, ten heat generation elements in the first embodiment including the power supply relays, the switching elements, and the motor relays may be disposed with respect to one pressing member.

In the above-described embodiments, each of the power supply relays, the switching elements, and the motor relays as the heat generations elements is the MOSFET. In another embodiment, each of the power supply relays, the switching elements, and the motor relays may have other configuration, such as an IGBT. In addition, in another embodiment, a heat generation element may be any electronic component, such as a resistor, a diode, or a coil, as long as the heat generation element can be mounted on a land.

The semiconductor modules according to the above-described embodiments are half-molded in which a part of the lands is exposed outside the molding part as the metal heat radiation portion, and are fixed to the heat sink via the heat radiation sheet. In another embodiment, a heat radiation gel may be used instead of the heat radiation sheet. The semiconductor module may be full-molded in which the metal heat radiation portion is not exposed. In this case, the heat radiation sheet and the heat radiation gel may be omitted.

In the first to sixth embodiments, the sources of the switching elements on the low-potential side are connected to the ground via the shunt resistors. In another embodiment, the source of the switching elements on the low-potential side may be connected by members similar to the wiring members. In this case, the shunt resistors may be disposed outside the semiconductor modules or may be omitted.

The motor drive apparatus according to the above-described embodiments includes the power substrate and the control substrate. In another embodiment, the number of substrate may be one. In the above-described embodiments, the power terminals and the ground terminals are connected to the high-potential side of the battery, the motor relay, the winding of the motor, or the ground via the power substrate. In another embodiment, the power terminals and the ground terminals may be directly connected to the high-potential side of the battery, the motor relay, the winding of the motor, or the ground without via the power substrate.

In the above-described embodiments, the semiconductor devices are applied to the motor drive apparatus. In another embodiment, the semiconductor devices may be applied to an apparatus other than the motor drive apparatus.

While the present disclosure has been described with reference to embodiments thereof, it is to be understood that the disclosure is not limited to the embodiments and constructions. The present disclosure is intended to cover various modifications and equivalent arrangements.

What is claimed is:

1. A semiconductor device comprising
a semiconductor module including a plurality of heat generation elements generating heat by energization, three or more conductive members each of which mounted with at least one of the heat generation elements, and a molding part integrally molding the heat generation elements and the conductive members, and
a pressing member pressing the semiconductor module to a heat radiation member, wherein
the semiconductor module has a heat radiation possible region in which a forcing pressure by the pressing member is equal to or greater than a predetermined pressure,
at least one of the conductive members is mounted with the heat generation element disposed outside the heat radiation possible region, and
the at least one of the conductive members has such a shape that at least a part of the conductive member is included in the heat radiation possible region.

2. The semiconductor device according to claim 1, wherein the at least one of the conductive members includes a base portion on which the heat generation element is mounted and a protruding portion protruding from an end of the base portion adjacent to the pressing member.

3. The semiconductor device according to claim 2, wherein each of the conductive members includes the protruding portion.

4. The semiconductor device according to claim 2, wherein an area of the protruding portion is smaller than an area of the base portion.

5. The semiconductor device according to claim 2, wherein at least one of the conductive members is mounted with only one of the heat generation elements.

6. The semiconductor device according to claim 2, wherein at least one of the conductive members is mounted with more than one of the heat generation elements.

7. The semiconductor device according to claim 1, wherein the heat generation elements include a plurality of switching elements forming an inverter section, and
each of the conductive members mounted with the switching elements has such a shape that at least a part of each of the conductive members is included in the heat radiation possible region corresponding to the pressing member.

8. The semiconductor device according to claim 1, wherein the heat generation elements include a plurality of switching elements forming an inverter section and a power supply relay connected between the inverter section and a power supply source, and
each of the conductive members mounted with the switching elements and the power supply relay has such a shape that at least a part of each of the conductive members is included in the heat radiation possible region corresponding to the pressing member.

9. The semiconductor device according to claim 1, wherein the heat generation elements include a plurality of switching elements forming an inverter section, a power supply relay connected between the inverter section and a power supply source, and a load relay connected between the inverter section and a load, and
each of the conductive members mounted with the switching elements, the power supply relay, and the load relay has such a shape that at least a part of each of the conductive members is included in the heat radiation possible region corresponding to the pressing member.

* * * * *